United States Patent
He et al.

(10) Patent No.: US 10,756,282 B2
(45) Date of Patent: Aug. 25, 2020

(54) TWO-DIMENSIONAL HYBRID PEROVSKITES LAYER-EDGE DEVICE AND METHOD

(71) Applicant: KING ABDULLAH UNIVERSITY OF SCIENCE AND TECHNOLOGY, Thuwal (SA)

(72) Inventors: Jr-Hau He, Thuwal (SA); Bin Cheng, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/663,620

(22) Filed: Oct. 25, 2019

(65) Prior Publication Data

US 2020/0176698 A1 Jun. 4, 2020

Related U.S. Application Data

(60) Provisional application No. 62/774,497, filed on Dec. 3, 2018.

(51) Int. Cl.
*H01L 51/42* (2006.01)
*H01L 51/44* (2006.01)
*C30B 29/60* (2006.01)

(52) U.S. Cl.
CPC ........ *H01L 51/4213* (2013.01); *H01L 51/441* (2013.01); *H01L 51/447* (2013.01);
(Continued)

(58) Field of Classification Search
CPC .. H01L 51/4213; H01L 51/441; H01L 51/447
See application file for complete search history.

(56) References Cited

U.S. PATENT DOCUMENTS

2015/0380667 A1* 12/2015 Koposov ............. H01L 51/4213
136/256
2016/0251383 A1* 9/2016 Zhu ........................... C07F 7/24
556/81

(Continued)

OTHER PUBLICATIONS

Pasha et al., Conductivity and dielectric properties of PEDOT-PSS doped DMSO nano composite thin films, Apr. 18, 2016, Journal of Materials Science: Materials in Electronics, vol. 27, pp. 8336-8338.*

(Continued)

*Primary Examiner* — Allan R Wilson
(74) *Attorney, Agent, or Firm* — Patent Portfolio Builders PLLC

(57) ABSTRACT

A photovoltaic device that absorbs optical energy and generates electrical energy, the photovoltaic device including a base; a two-dimensional (2D) organic-inorganic perovskite layer assembly located on the base, wherein the 2D organic-inorganic perovskite layer assembly includes an inorganic layer sandwiched by first and second organic layers; and first and second electrodes formed on a surface of the 2D organic-inorganic perovskite layer assembly, opposite to the base. A location of the first and second electrodes is selected to define a layer-edge 0° surface, which extends within the surface of the 2D organic-inorganic perovskite layer assembly, parallel to an edge of the inorganic layer.

20 Claims, 21 Drawing Sheets

(52) U.S. Cl.
CPC ........ *C30B 29/60* (2013.01); *H01L 2251/303* (2013.01); *H01L 2251/55* (2013.01)

(56) References Cited

U.S. PATENT DOCUMENTS

2018/0269005 A1* 9/2018 Zhu ..................... H01G 9/0036
2018/0277695 A1* 9/2018 Garten ................. H01L 31/032

OTHER PUBLICATIONS

Blancon, J.C. et al., Extremely Efficient Internal Exciton Dissociation Through Edge States in Layered 2D Perovskites, Science, Mar. 24, 2017, vol. 355, pp. 1288-1292.

Cheng, B. et al., "Extremely Reduced Dielectric Confinement in Two-Dimensional Hybrid Perovskites with Large Polar Organics," Communications Physics, Nov. 15, 2018, vol. 1, Article No. 80, pp. 1-8.

Mercier, N. et al., "Unique Hydrogen Bonding Correlating with a Reduced Band Gap and Phase Transition in the Hybrid Perovskites $(HO(CH_2)_2NH_3)_2PbX_4$ (X=I, Br)," Inorganic Chemistry, Nov. 24, 2004, vol. 43, pp. 8361-8366.

Ren, K. et al., "Turning a Disadvantage into an Advantage: Synthesizing High-Quality Organometallic Halide Perovskite Nanosheet Arrays for Humidity Sensors," Journal of Materials Chemistry C, Jan. 16, 2017, vol. 5, Issue 10, pp. 2504-2508.

Tsai, M.-L et al., "Single Atomically Sharp Lateral Monolayer p-n Heterojunction Solar Cells with Extraordinarily High Power Conversion Efficiency," Advanced Materials, Jun. 26, 2017, 29, pp. 1701168 (1-7).

* cited by examiner

TWO-DIMENSIONAL HYBRID PEROVSKITES LAYER-EDGE DEVICE AND METHOD

CROSS-REFERENCE TO RELATED APPLICATIONS

This application claims priority to U.S. Provisional Patent Application No. 62/774,497, filed on Dec. 3, 2018, entitled "LAYER-EDGE DEVICE BASED ON LOW DIELECTRIC CONFINED LAYERED ORGANIC-INORGANIC HYBRID PEROVSKITES," the disclosure of which is incorporated herein by reference in its entirety.

BACKGROUND

Technical Field

Embodiments of the subject matter disclosed herein generally relate to a photovoltaic device, and more particularly, to using layer-edge surfaces, which are out-of-plane surfaces perpendicular to a superlattice plane of a two-dimensional (2D) layered organic-inorganic hybrid perovskite (2D perovskite herein), for transforming light into electrical currents or electrical currents into light.

Discussion of the Background

Organic-inorganic hybrid perovskites $MAPbX_3$ ($MA=CH_3NH_3$, $X=Cl$, Br, I; 3D perovskites herein) have achieved a power conversion efficiency (PCE) of over 20% in photovoltaic solar cells and also are promising materials for fabricating light-emitting diodes and lasers.

Due to the high-absorption coefficient, intense photoluminescence (PL), low electron—hole recombination rate, and long carrier diffusion length, the organic-inorganic hybrid perovskites (3D perovskites) are regarded as one of the leading candidates of next-generation photovoltaics. Recently, two-dimensional layered organic-inorganic halide perovskites (2D perovskites) have attracted attention as an alternative to 3D perovskites in photovoltaic devices because of their improved stability and moisture resistance. In addition, as a result of weak Van der Waals forces between the organic layers, 2D perovskite nanosheets can be produced by solution-based method and mechanical exfoliation, making them a new platform for low-dimensional nanoelectronics/optoelectronics.

However, following the general trend of quantum confinement, the exciton-binding energy of 2D perovskites is much larger compared to their 3D counterpart. Moreover, because the conventional organic linkers used in 2D perovskites, such as $C_6H_5(CH_2)_2NH_3^+$ and $C_4H_9NH_3^+$ have small dielectric constants, dielectric confinement also emerges and makes the exciton-binding energy even larger. Such large exciton binding energy makes it difficult for excitons to form free carriers via thermal activation. Accordingly, the strong combined effect of quantum and dielectric confinement makes the carrier mobility in 2D perovskites approximately two orders of magnitude lower than that in 3D perovskites.

To fully utilize the optoelectronic properties of 2D perovskites for photoelectric applications, methods to lower the confinement in the 2D perovskites are needed. The quantum confinement can be reduced by increasing the width of the inorganic semiconductor layer in 2D perovskites. However, even when the width of the inorganic layer is enlarged five times, the binding energy is still up to 200 meV, which is still too large.

Therefore, it is necessary to develop an alternative approach to "weaken" the dielectric confinement in 2D perovskites. However, the current method of reducing the dielectric confinement by intercalation can only lower the exciton-binding energy by tens of meV, which is not enough for achieving effective thermal dissociation of excitons at room temperature.

Thus, there is a need for a new 2D perovskite material that reduces the dielectric confinement.

BRIEF SUMMARY OF THE INVENTION

According to an embodiment, there is a photovoltaic device that absorbs optical energy and generates electrical energy, and the photovoltaic device includes a base, a two-dimensional (2D) organic-inorganic perovskite layer assembly located on the base, where the 2D organic-inorganic perovskite layer assembly includes an inorganic layer sandwiched by first and second organic layers, and first and second electrodes formed on a surface of the 2D organic-inorganic perovskite layer assembly, opposite to the base. A location of the first and second electrodes is selected to define a layer-edge 0° surface, which extends within the surface of the 2D organic-inorganic perovskite layer assembly, parallel to an edge of the inorganic layer.

According to another embodiment, there is a photovoltaic device that absorbs electrical energy and generates optical energy, and the photovoltaic device includes a base, a two-dimensional (2D) organic-inorganic perovskite layer assembly located on the base, wherein the 2D organic-inorganic perovskite layer assembly includes an inorganic layer sandwiched by first and second organic layers, and first and second electrodes formed on a surface of the 2D organic-inorganic perovskite layer assembly, opposite to the base. A location of the first and second electrodes is selected to define a layer-edge 90° surface, which extends within the surface of the 2D organic-inorganic perovskite layer assembly, perpendicular to the inorganic layer.

According to yet another embodiment, there is a method for making a photovoltaic device that transforms electrical energy into optical energy or vice versa. The method includes placing a two-dimensional (2D) organic-inorganic perovskite layer assembly, formed as a single crystal, onto a substrate, wherein the 2D organic-inorganic perovskite layer assembly includes an inorganic layer sandwiched by first and second organic layers, determining an orientation of the inorganic layer, selecting locations of first and second electrodes to define (1) a layer-edge 0° surface, which extends within the surface of the 2D organic-inorganic perovskite layer assembly, parallel to an edge of the inorganic layer, or (2) a layer-edge 90° surface, which extends within the surface of the 2D organic-inorganic perovskite layer assembly, perpendicular to the inorganic layer, and forming the first and second electrodes on the surface of the 2D organic-inorganic perovskite layer assembly, opposite to the base, at the selected locations.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

Figure 1:
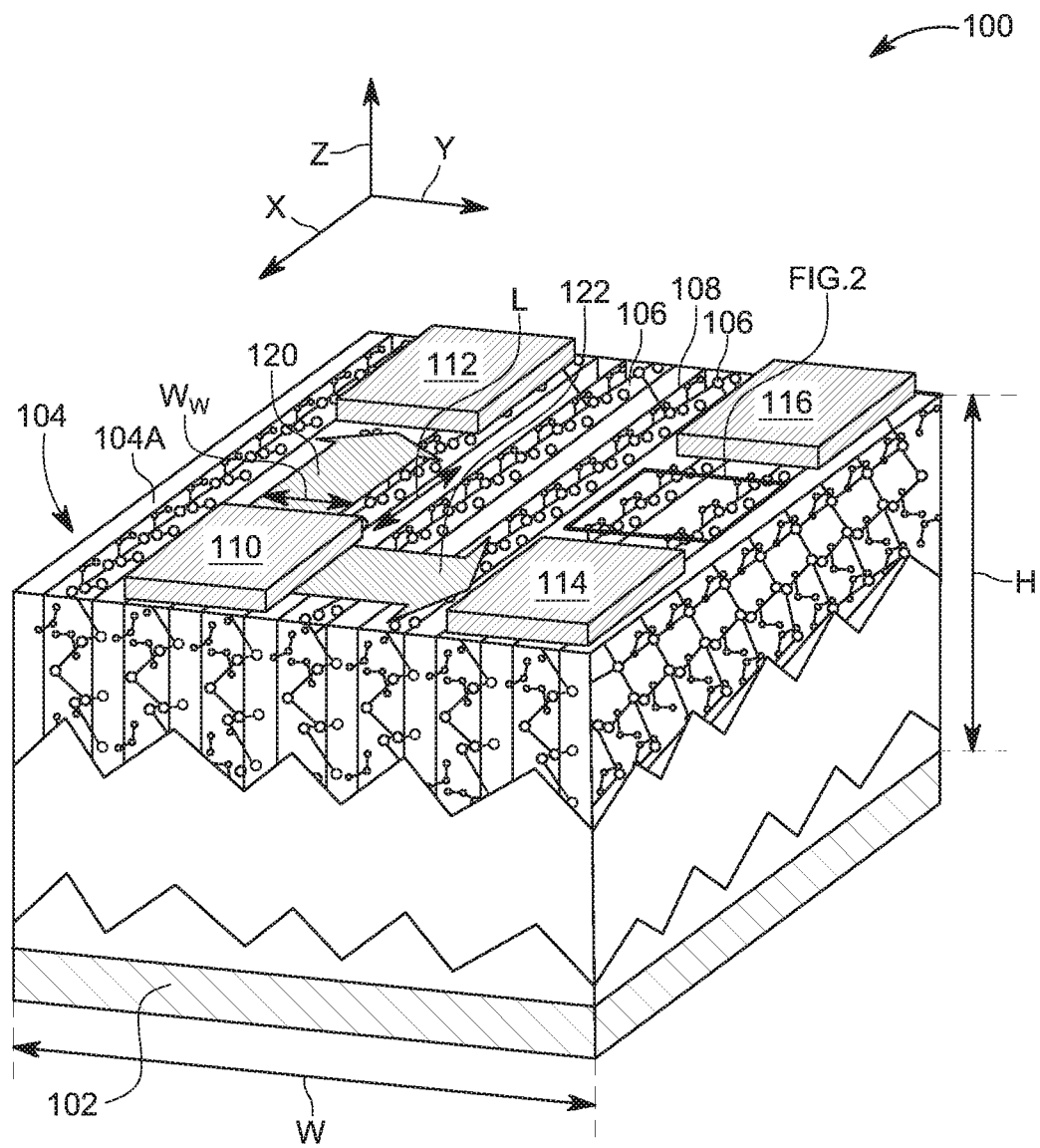
FIG. 1 illustrates a photovoltaic layer-edge device configured to achieve carrier transportation in one of a layer-edge 0° surface and a layer-edge 90° surface or both.

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to a 2D perovskite based device that uses large polar organics such as $HOC_2H_4NH_3^+$ (ethanolamine or EA) to form intermediate organic layers so that a dipole-dipole force can largely enhance the interaction between the organic layers. However, the embodiments to be discussed next are not limited to EA, but may use other large polar organics, as for example, $C_6H_5(CH_2)_2NH_3$ (2-phenylethylammonimum or PEA). Those skilled in the art will understand that other organics may also be used.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, a layer-edge surface device of 2D hybrid perovskite with various inorganic layer thickness is fabricated. Strong anisotropic electronic/optoelectronic properties are exhibited by this material, which is caused by the organic/inorganic layer staggered multiple quantum well structures. Such anisotropy is decreased as the thickness of the inorganic layers increases. The existence of large anisotropy of electronic transport in 2D perovskites indicates the importance of the choice of crystalline orientation in the layer-edge device. Such material also exhibits high-humidity sensitivity due to the abundant hydroxyl groups. The humidity sensing properties of the layer-edge device using 2D perovskite strongly depend on the organic groups adopted, indicating that such properties can be controlled by selecting the composition of the organic layer. The 2D perovskite discussed herein can be provided with electrodes, which when placed along a layer-edge 0° surface or a layer-edge 90° surface, reveal unusual transport properties, and indicates the potential manufacturing of a humidity sensor based on 2D perovskite single crystals.

Just like for conventional semiconductor devices, the surfaces and interfaces of the structure play a role in the electronic and opto-electronic performance of the hybrid perovskites based photovoltaic devices. Especially in the two-dimensional layered organic-inorganic hybrid perovskites, the out-of-plane surface perpendicular to the superlattice plane of the 2D perovskites, which is named herein the layer-edge surface, has a unique organic-inorganic staggered superlattice pattern, because of the presence of multiple quantum well structures. Because of the parasitic layer-edge states, such exotic layer-edge surface plays an important role in dissociating the electron-hole pairs in the excitons into the free carriers, and extend the lifetime of those carriers, leading to a largely improved efficiency in 2D perovskite based solar cells [1], [2].

FIG. 1 illustrates a novel photovoltaic layer-edge device 100 that is capable of transforming light energy into electrical energy or electrical energy into light energy. The photovoltaic layer-edge device 100 exhibits highly anisotropic electrical and optoelectronic conductance. Moreover, as the thickness of the inorganic layer (Pb—I in one embodiment) increases, the anisotropy is less pronounced, and the rise time and recovery time of the photo response decrease. The photovoltaic layer-edge device is found to be extremely sensitive to environmental humidity, due to the abundant hydroxyl groups, which can promote water condensation. The term "photovoltaic" is used herein to indicate that either the device transforms light energy into electrical energy (e.g., a solar cell) or electrical energy into light energy (e.g., a light emitting diode, LED).

Figure 2:
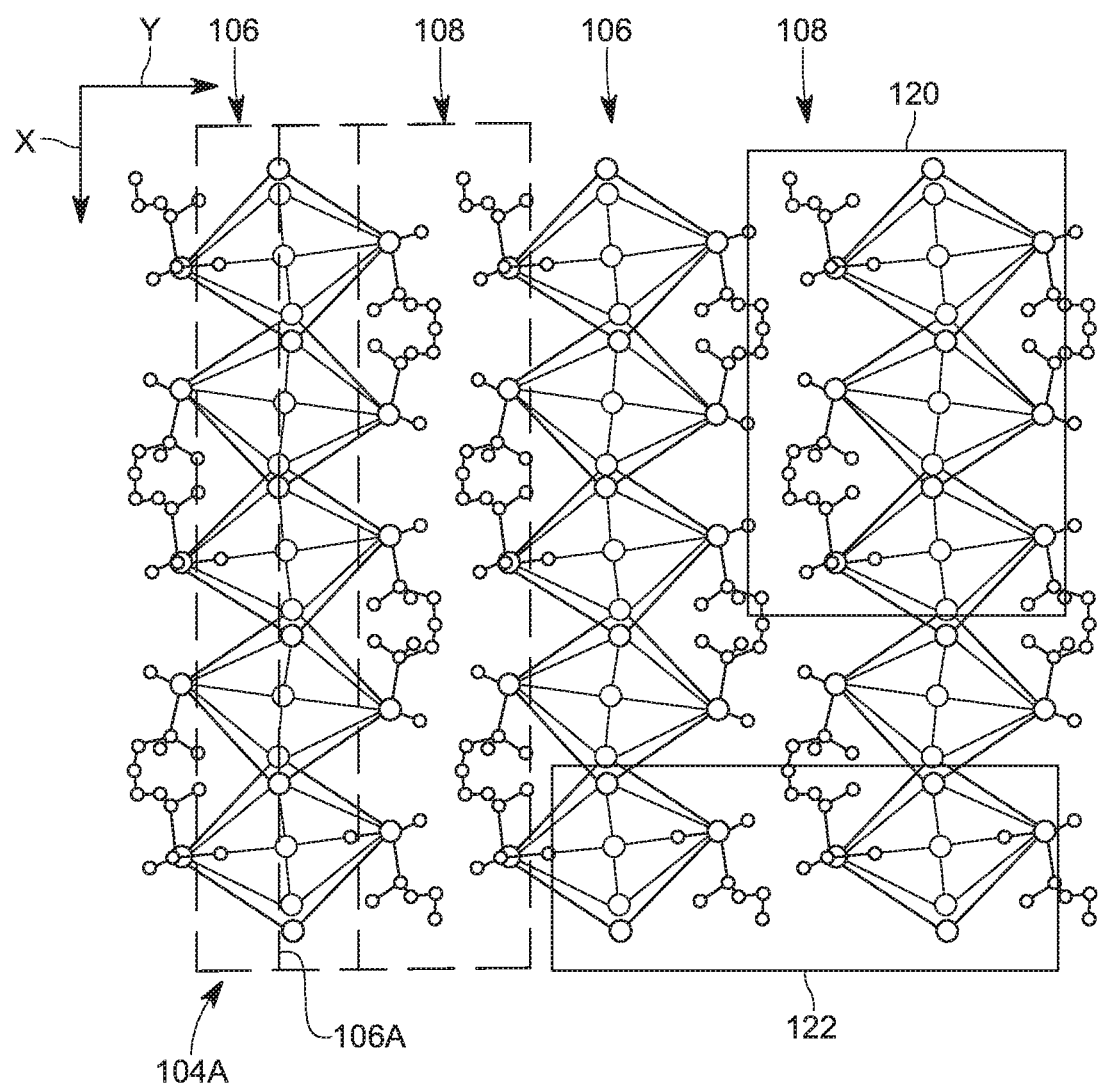
FIG. 2 illustrates a top surface of the photovoltaic layer-edge device of FIG. 1.

The physical structure of the photovoltaic layer-edge device 100 is illustrated in FIGS. 1 and 2. FIG. 1 shows a base 102 (which can be a silicon base) on top of which the 2D perovskite layer assembly 104 is formed. Two or more electrodes 110 to 116 may be formed on the top surface of the 2D perovskite layer assembly 104. The 2D perovskite layer assembly 104 includes at least two inorganic layers 106 separated by an organic layer 108. Plural inorganic and organic layers may be present within the 2D perovskite layer assembly 104. FIG. 2 is a top view (corresponding to the XY plane in FIG. 1) of the photovoltaic layer-edge device 100, showing in more detail the positions of the inorganic layers 106, an edge 106A of an inorganic layer 106, and the organic layers 108. Each inorganic layer 106 has a thickness in the order of nanometers, and for this reason, the inorganic perovskite layer is considered to be a 2D layer. In this embodiment, a single organic layer 108 is sandwiched between two adjacent inorganic perovskite layers 106 and a single inorganic layer 106 is sandwiched between two adjacent organic layers, as illustrated in FIG. 2.

Note that a 2D perovskite inorganic layer 106 extends in the plane XZ in FIG. 1. The plane XZ is considered herein to be the in-plane, while the planes XY and ZY are the out-of-planes. The photovoltaic layer-edge device 100 is shown in FIGS. 1 and 2 to have a single crystalline structure and it was grown to be centimeter-wide (W) and millimeter-thick (H).

The electrodes 110 to 116 are strategically placed on the top surface 104A of the 2D perovskite layer assembly 104 so that the electrodes 110 and 112 sandwich (and define) a layer-edge 0° surface 120 and the electrodes 110 and 114 sandwich (and define) a layer-edge 90° surface 122. Note that the layer-edge 0° surface 120 extends in the XY plane, parallel to the edge 106A of the inorganic layer 106, while the layer-edge 90° surface 122 extends in the XY plane, perpendicular to the inorganic layer 106. As the inorganic layer 106 is considered to define the in-plane (e.g., XZ plane), the two layer-edges surfaces 120 and 122 extend out-of-plane. This feature is important for the device 100 because the layer-edge surfaces 120 and 122 effectively define the edges of the inorganic layers 106, and the electrical carriers (electrons and holes) formed at these edges of the inorganic layers exhibit a much better charge transport than the traditional layers. In other words, the configuration of a semiconductor layer (the inorganic layer 106) sandwiched between non-conducting layers (the organic layers 108) generates an unexpected result in terms of the conductivity of the electrical carriers and the reduced energy necessary to form the electrical carriers, which are advantageous over the known materials. In one application, a length L of the layer-edge surface 120 or 122 is selected to be about 50 μm and a width WW of these surfaces is selected to be about 500 μm. Those skilled in the art will understand that these sizes may be changed, for example, up to 50%, and still achieve the features discussed herein.

Therefore, the photovoltaic layer-edge device 100 has a metal-semiconductor-metal structure, where the metal corresponds to the electrodes and the semiconductor corresponds to the inorganic layers. Further, by selecting the organic layers to have a desired dielectric constant, it is possible to tune the dielectric confinement effect of the device. For example, by selecting a high dielectric constant organic layer, an extremely low dielectric confinement is obtained. For this example, which is discussed later, the exciton-binding energy is ~13 meV, which is 20 times smaller than that in the high dielectric-confined 2D perovskites. Moreover, the low dielectric-confined 2D perovskite single crystal shows very good photo-excited carrier extraction efficiency due to the largely improved carrier mobility and reduced exciton-binding energy, and outstanding moisture resistance due to the strong hydrogen bonding between the organic layers. In one embodiment, the dielectric constant of the organic layer is selected to be at least 20. An organic layer having a dielectric constant higher than 20 is considered herein to be a high dielectric constant organic material.

Figure 3A:
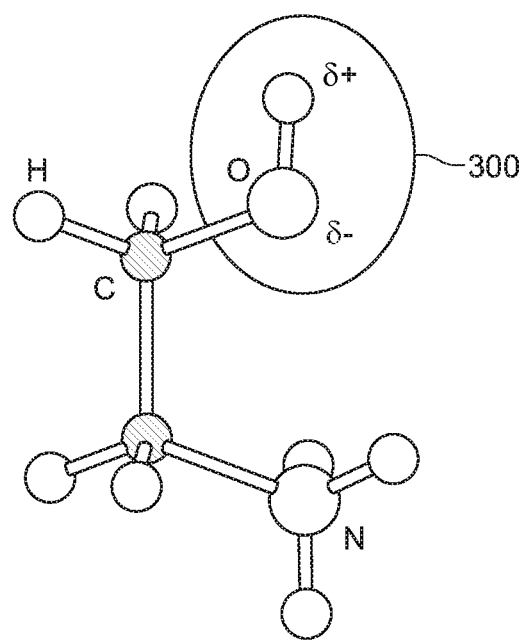
FIG. 3A illustrates the physical and chemical structure of a first polymer to be used in the photovoltaic layer-edge device.
Figure 3B:
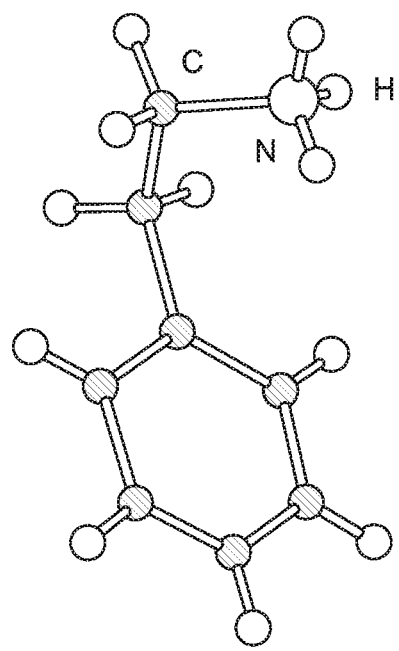
FIG. 3B illustrates the physical and chemical structure of a second polymer to be used in the photovoltaic layer-edge device.

The photovoltaic layer-edge device 100 illustrated in FIGS. 1 and 2 is selected to have the inorganic layers made of $PbI_4$ and the organic layers made of EA. To fabricate the photovoltaic layer-edge device 100, a 2D perovskite single crystal with a large enough layer-edge surface is required. In the commonly used 2D perovskites, because the Van der Waals interaction between the organic layers is quite weak, an extreme preference of growing along the Pb—I plane (plane XZ in FIG. 1) leads to a limited thickness of the single crystals. In order to increase the growth preference perpendicular to the Pb—I plane, the photovoltaic layer-edge device 100 uses large polar organics EA ($HOC_2H_4NH_3^+$), which is shown in FIG. 3A, to form the organic layers 108 so that a large dipole-dipole force 300 can largely enhance the interaction between the organic layers [3], [4]. Note that another large polar organics PEA ($C_6H_5(CH_2)_2NH_3$), see FIG. 3B, has been also used to form the device 100, instead of EA. The organic layers made of EA performed better than those made of PEA. A cooling method (discussed later) has been used to obtain the centimeter-wide and millimeter-thick single crystals of $(HOC_2H_4NH_3)_2PbI_4$, which form the 2D perovskite layer assembly 104.

Figure 4:
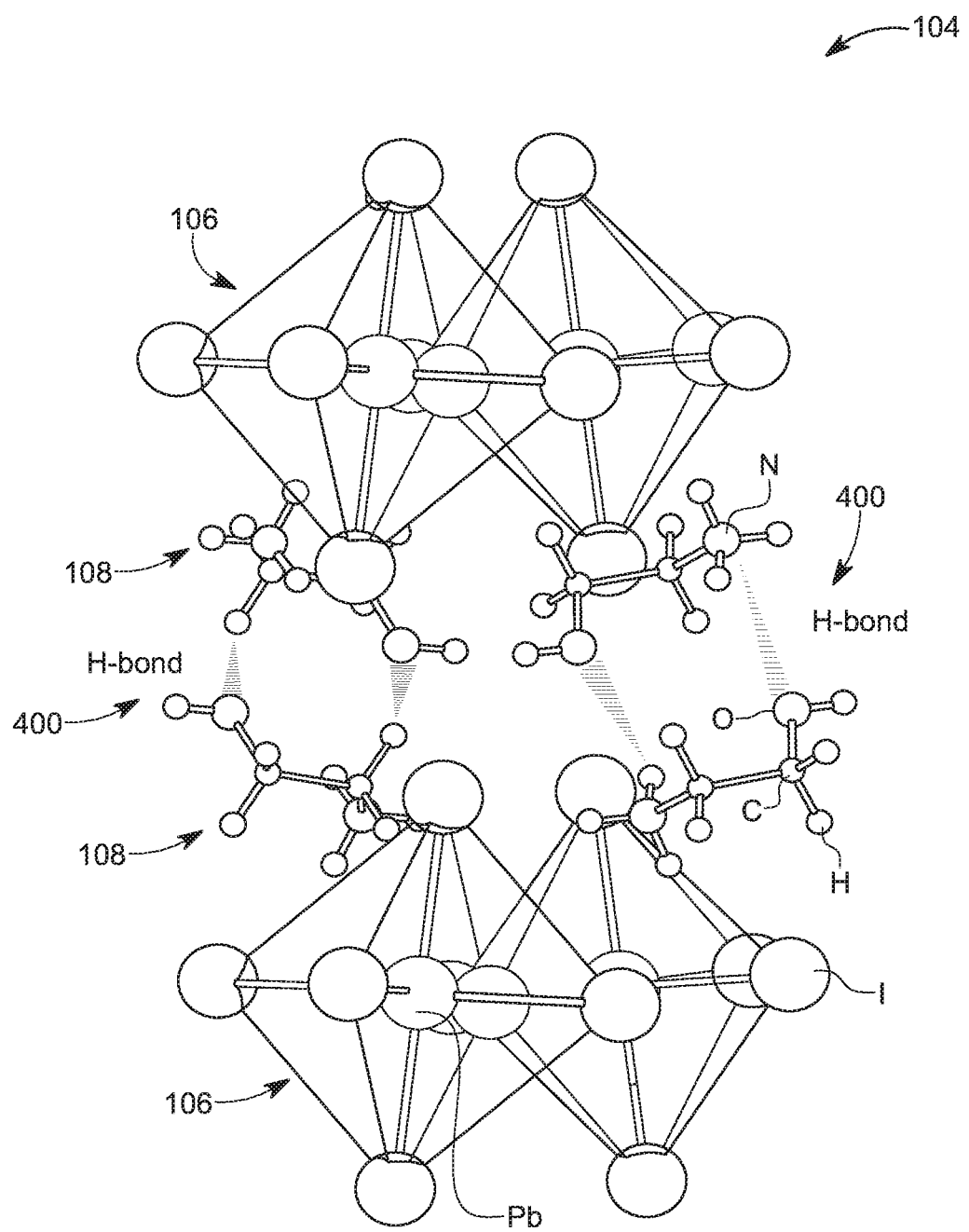
FIG. 4 illustrates hydrogen bonds between organic layers formed in the photovoltaic layer-edge device.
Figure 5:
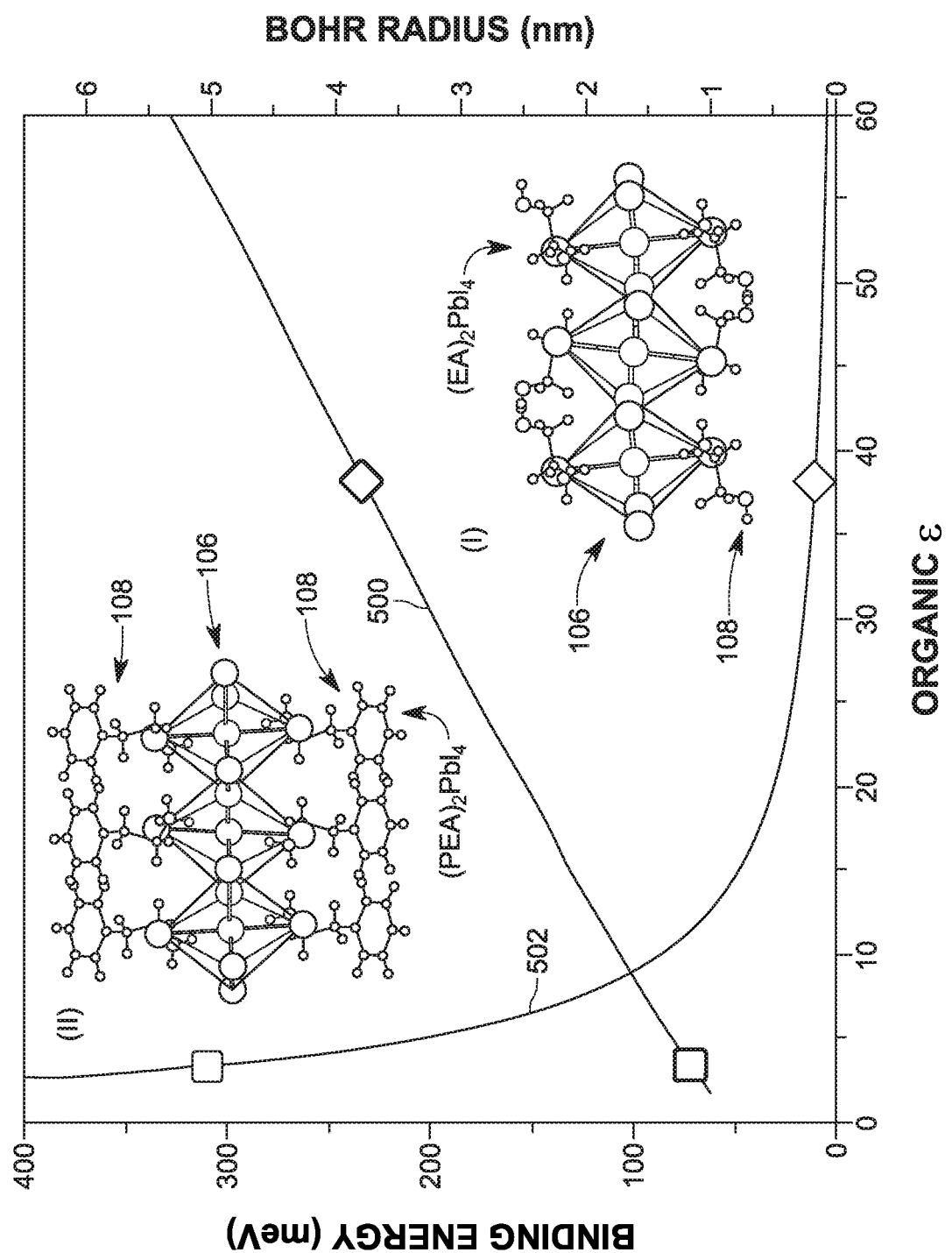
FIG. 5 illustrates the exciton-binding energy and the Bohr radius for the first and second polymers of FIGS. 3A and 3B, which are used in the photovoltaic layer-edge device.

FIG. 4 illustrates hydrogen bonds 400 that are formed between the organic layers 108 for the $(HOC_2H_4NH_3)_2PbI_4$ 2D perovskite layer assembly 104 and FIG. 5 illustrates the exciton-binding energy and Bohr radius for the device 100 when having organic layers based on EA or PEA. Note that EA has a high dielectric constant while PEA has a low dielectric constant. When the dielectric constant of the organic component is small, such as for the PEA-based layer, whose dielectric constant is ~3.314, the Bohr radius 500 describing the mean distance between the electron and hole in the exciton will decrease and accordingly the exciton-binding energy will be largely enhanced indicating a strong dielectric confinement. Conversely, as the dielectric constant of the organic layers 108 increases, the dielectric screening effect will be enhanced, so that the Coulomb force between electron and hole of the exciton will decrease, leading to an increased Bohr radius and decreased exciton-binding energy 502. Note that the calculated exciton-binding energies and Bohr radii are shown in FIG. 5 with a square for PEA and a diamond for EA. If the dielectric constant of the organic layer is sufficiently large, it is possible to achieve an exciton-binding energy similar to that of 3D perovskites.

To achieve low-dielectric-confined 2D perovskites, the EA has been used to form the organic layers (inset I of FIG. 5). EA has a dielectric constant as high as 37.721, because of the charge dipole induced by hydroxy group and short carbon chain shown in FIG. 3A. For comparison purposes, the inventors also conducted measurements on PEA perovskites single crystal (inset II of FIG. 5), a conventional and widely used 2D perovskites. Temperature-dependent PL measurements were performed on both EA and PEA perovskite single crystals to determine the exciton-binding energies. The PL intensity of the EA perovskites dropped rapidly as the temperature increases from 50 to 160 K, indicating that the attractive force between electron and hole in the exciton is extremely weak because of the strong screening effect. Meanwhile the PL intensity of the PEA perovskites showed a much slower decreasing rate as the temperature increased, indicating a more stable bound state for the excitons. Integrated PL intensity was calculated and Arrhenius equation fitting was used to determine the thermal dissociation ratio of the samples, which resulted in a binding energy of ~13 meV for EA perovskites and of ~250 meV for PEA perovskites. The absorption of the micron-size flakes of these two 2D perovskites were also measured, and in the PEA sample, the exciton peak is prominent, while in the EA sample the exciton peak is absent, indicating that the exciton-binding energy in the EA perovskites is much lower than that in PEA, which agrees with the temperature-dependent PL measurements. The exciton-binding energy of the EA perovskites is as low as that of 3D perovskites, and one order-of-magnitude smaller than the lowest reported binding energy of conventional 2D perovskites, making thermally activated exciton dissociation to free carriers much more effective than that for conventional 2D perovskites.

Figure 6:
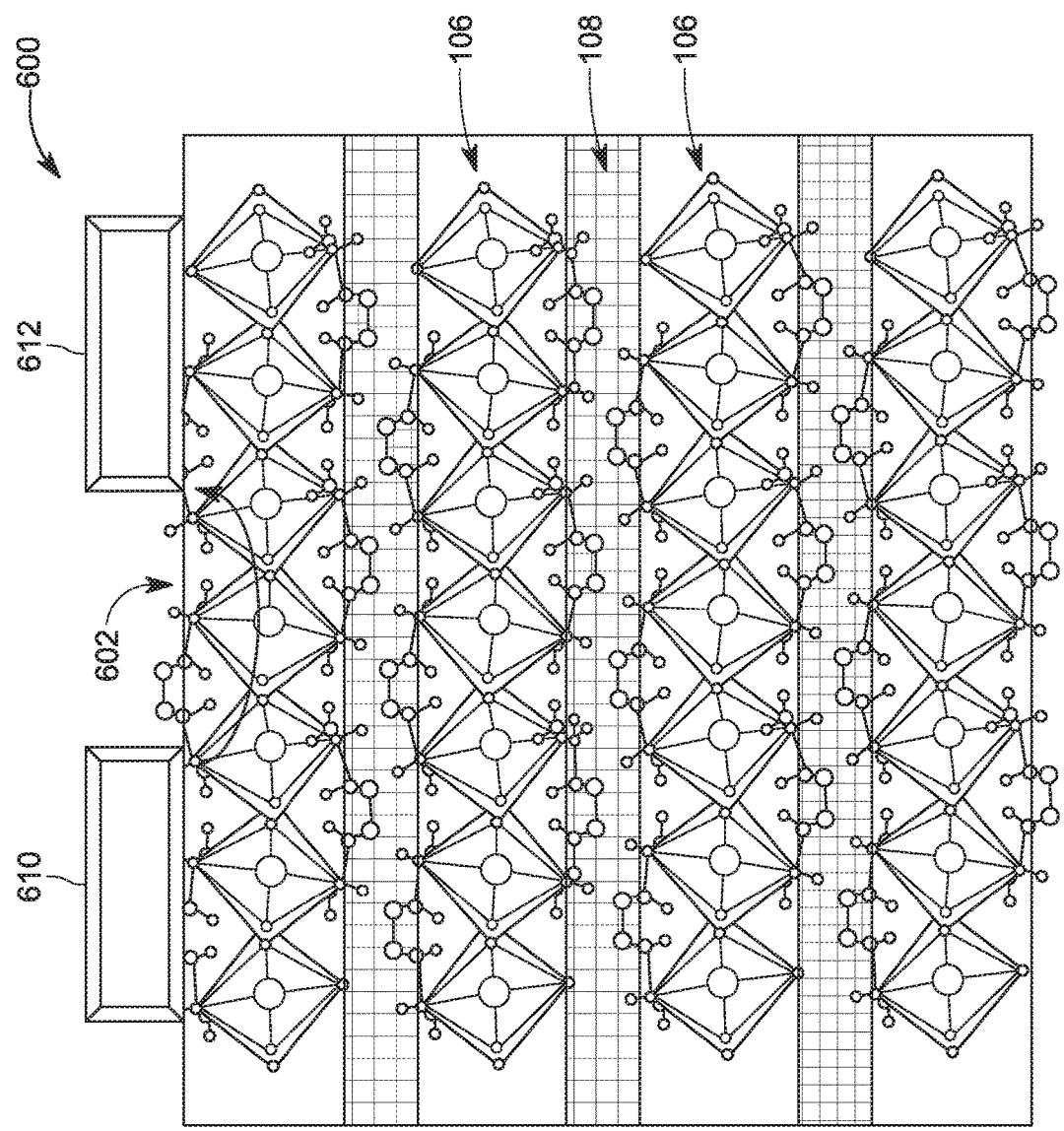
FIG. 6 illustrates the photovoltaic layer-edge device having electrodes placed in-plane.

Next, the EA based 2D perovskite is considered for determining its opto-electronic properties. For the purpose of investigating the electronic and opto-electronic transport properties of the layer-edge surface of the EA-based 2D perovskite, both the layer-edge 0° surface 120 and the layer-edge 90° surface 122 of the metal-semiconductor-metal device 100 were fabricated by depositing Au electrodes 110 to 116, with the same active area and deposition conditions. A device 600 configured to have the electrodes 610 and 612 arranged on the in-plane surface 602, which extends in the plane YZ in FIG. 6, was also fabricated for comparative experiments. From the AFM data, it is observed that the roughness of the layer-edge surface 120 and the in-plane surface 602 is about 5 nm and 1 nm, respectively.

Figure 7A:
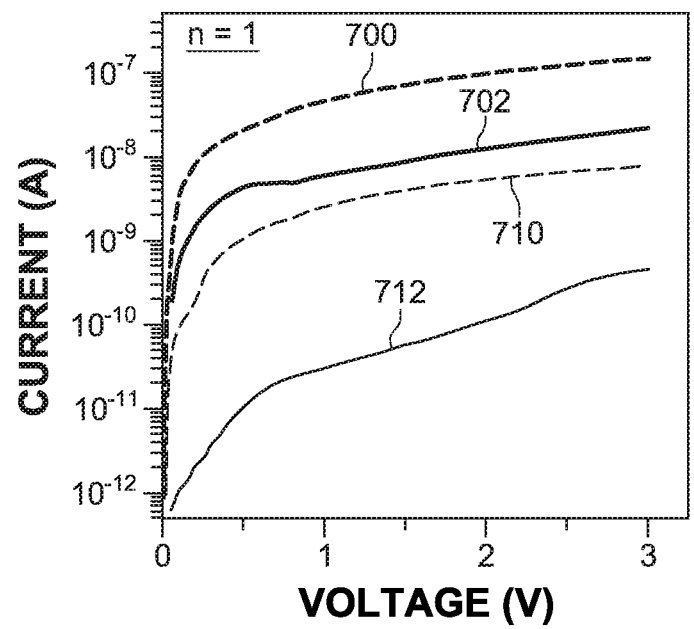
FIG. 7A shows the current-voltage characteristics.
Figure 7B:
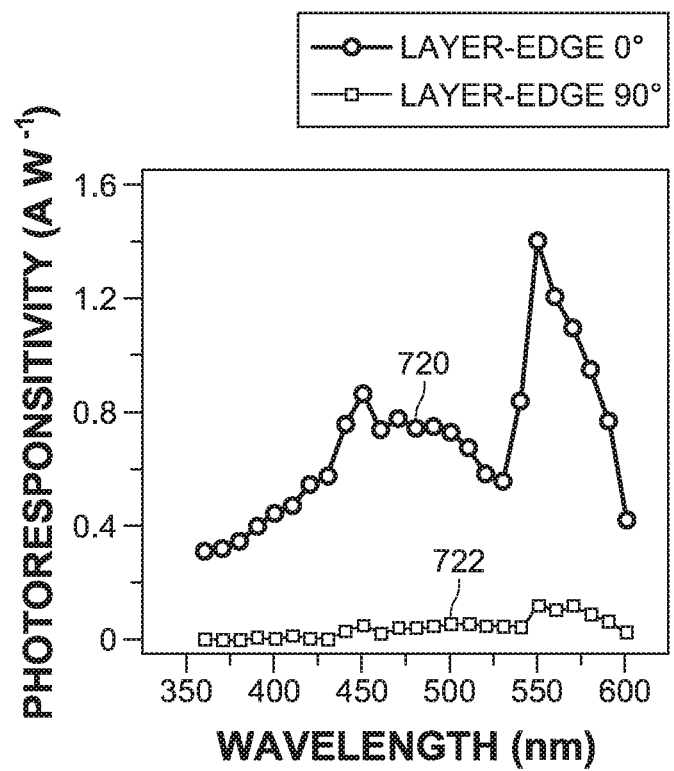
FIG. 7B shows the photoresponsivity versus the wavelength.
Figure 7C:
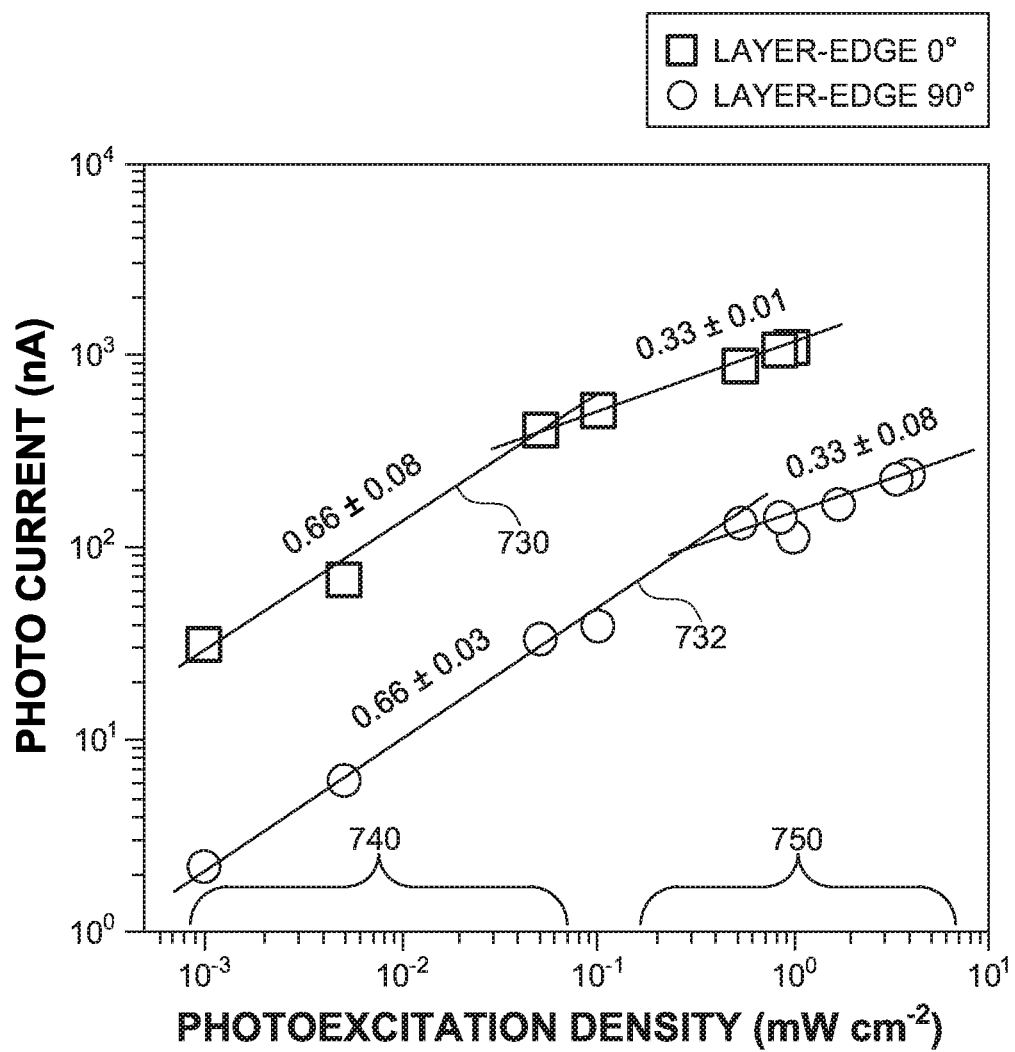
FIG. 7C shows the photo current versus the photoexcitation for the layer-edge 0° surface and the layer-edge 90° surface of the photovoltaic layer-edge device.

An I-V characterization of the layer-edge device 100 indicates that the dark current 700 in the layer-edge 0° device is about two-orders larger than the dark current 710 in layer-edge 90° device (see FIG. 7A), while the photo current 702 of the layer-edge 0° surface 120 and the photo current 712 of the layer-edge 90° surface 122 show about one order of magnitude difference. For the photo responsivity measurements, the bias voltage was fixed at 3 volts and the photo responsivity was measured over a wide range of incident light wavelength from 360 nm to 600 nm, as illustrated in FIG. 7B, which indicate that the layer-edge 0° surface current 720 and the layer-edge 90° surface current 722 have a similar wavelength dependence. The largest photo responsivity for both currents was found at 550 nm wavelength. The magnitude of the photo responsivity 730 in the layer-edge 0° surface 120 is close to the photo responsivity of the in-plane device and about one-order of magnitude larger than the photo responsivity 732 in the layer-edge 90° surface 122, as illustrated in FIG. 7C.

Such anisotropy of the transport properties is similar to the anisotropy observed in the excitonic response in the traditional 2D perovskites, indicating that the carrier transport mainly occurs along the Pb—I—Pb inorganic pathways (inorganic layer 106) while the carrier transport is blocked between the various inorganic layers 106, due to the confinement introduced by the high-dielectric constant organic layers 108. This indicates that in 2D perovskite thin film devices, a random orientation of the crystalline domains will create massive obstacles for the carrier transport, hindering the photovoltaic application and fundamental research. For that reason, the EA-based 2D perovskite of the device 100 has a single crystalline structure.

The illumination power density dependent photocurrent was measured at 3 volts bias voltage and 550 nm wavelength of incident light, so that the photo responsivity has the maximum value. As shown in FIG. 7C, the photo current Ip and the photoexcitation density D follow the power law relations $I_p \propto D^m$. Both the layer-edge 0° surface 120 and the layer-edge 90° surface 122 show two distinct power law regions in FIG. 7C: when the photoexcitation density is low (region 740), the trap-assisted recombination dominates with m=3/2. As the photoexcitation density is increased (region 750), the bimolecular recombination becomes the dominating mechanism, leading to m=⅓.

The decrease of m compared to the ideal values of ½ and 1 for the two recombination regimes in the traditional 2D perovskite in-plane devices has been reported by other groups, where two possible reasons were proposed: (1) exciton-exciton interactions, which are largely enhanced in the low-dimensional systems, and (2) limited collection of photo-generated charges blocked by the insulating organic layers. In the layer-edge device 100, the many-body interactions still play a key role, while the blockade of charge collection by the insulating 9 organic) layers 108 is suppressed due to the fact the that the electrical carriers can travel along the edges of the inorganic layers 106, thus by-passing the dielectric barrier posed by the organic layers. Another possible reason of the decreased value of m in the layer-edge device 100 may be the following. When the charge carriers are generated at the surface 104A, the carriers can diffuse into the bulk before they recombine. Because the incident light density increases, the carrier diffusion is suppressed due to the carrier recombination, which leads to a decrease of the carrier lifetime, and finally results in an effective desensitization of the photo conductivity property.

Figure 8A:
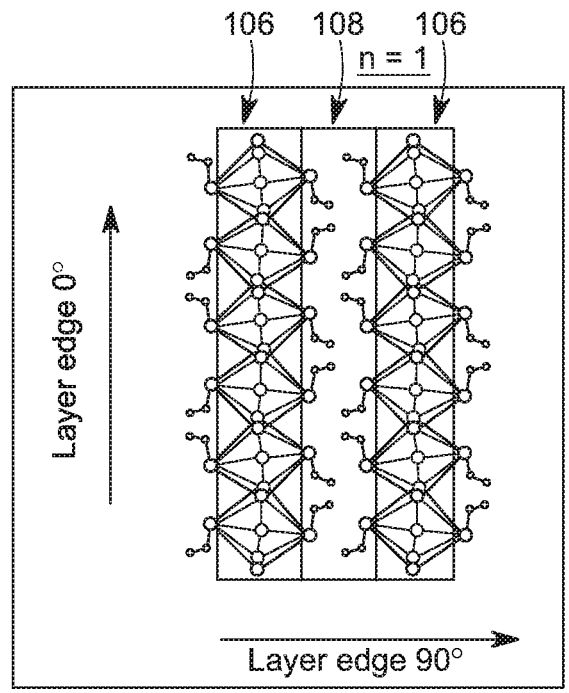
FIGS. 8A to 8D illustrate the photovoltaic layer-edge device with an increasing number of inorganic layers sandwiched between two organic layers.
Figure 8B:
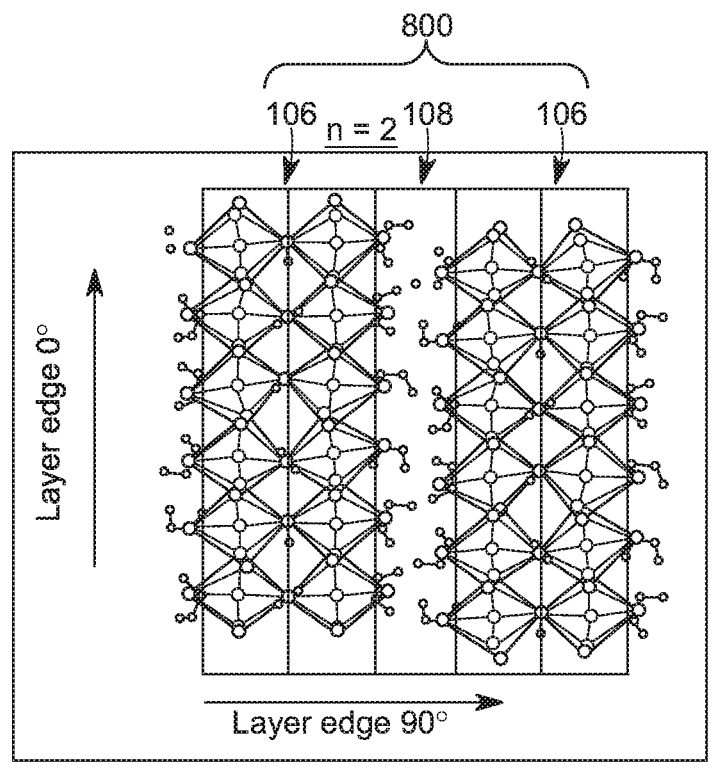
Figure 8C:
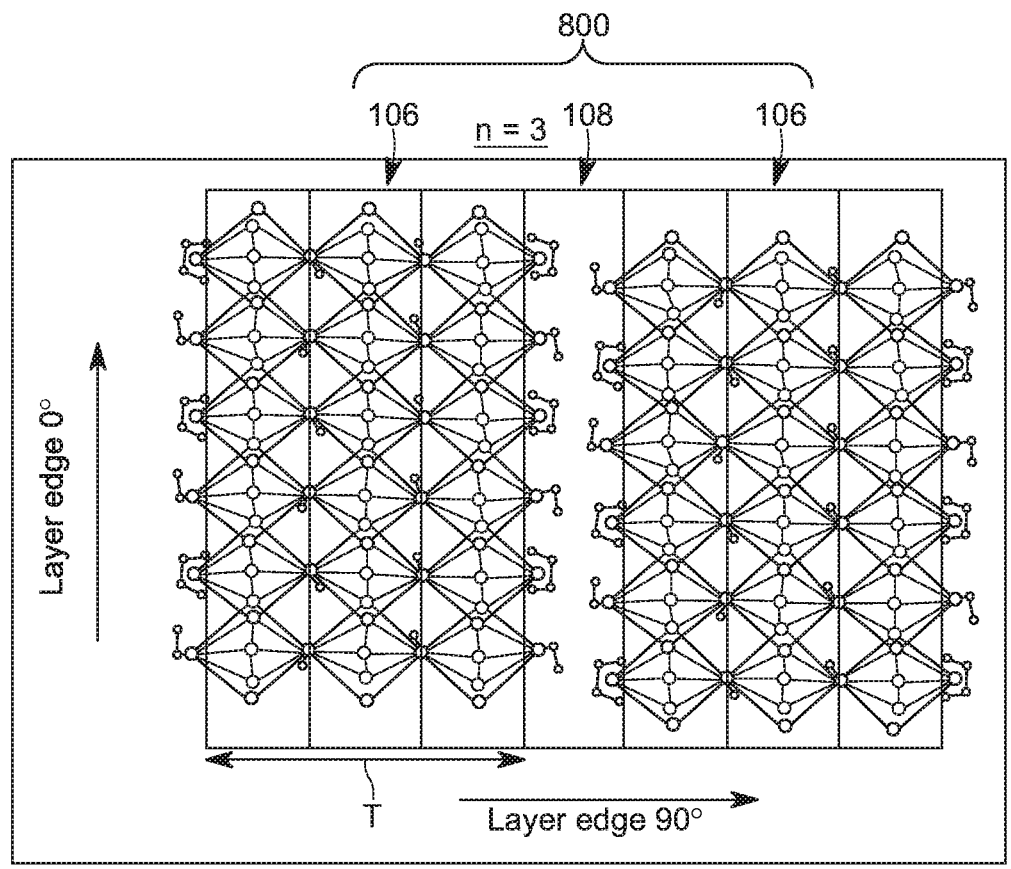
Figure 8D:
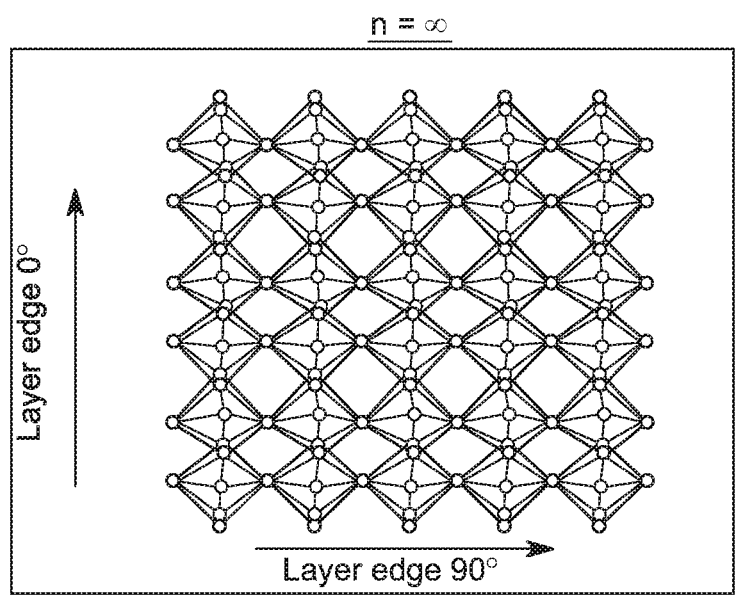

In another embodiment, the inventors succeeded to grow a single crystal EA-based 2D perovskite assembly with various thicknesses of inorganic layers. For this new assembly, the following chemical formula is introduced $EA_2MA_{n-1}PbI_{3n+1}$, where $EA=HOC_2H_4NH_3^+$, $MA=CH_3NH_3^+$, and n represents the number of inorganic layers 106 between two ammonium-based organic layers 108 consisting of EA. This novel single crystal EA-based 2D perovskite assembly 800 is illustrated in FIGS. 8A to 8D, with FIG. 8A showing a single (n=1) inorganic layer 106 sandwiched between two organic layers 108, FIG. 8B showing two (n=2) inorganic layers 106 sandwiched between two organic layers 108, FIG. 8C showing three (n=3) single inorganic layers 106 sandwiched between two organic layers 108, and FIG. 8D showing a large number of inorganic layers. The single crystal structure of the $EA_2MA_{n-1}PbI_{3n+1}$ for n=1, 2 and 3 was determined by Single Crystal XRD. By enlarging the thickness T of the semiconductor layer 106 in a quantum well structure results into a decrease of the quantum confinement.

Figure 9:
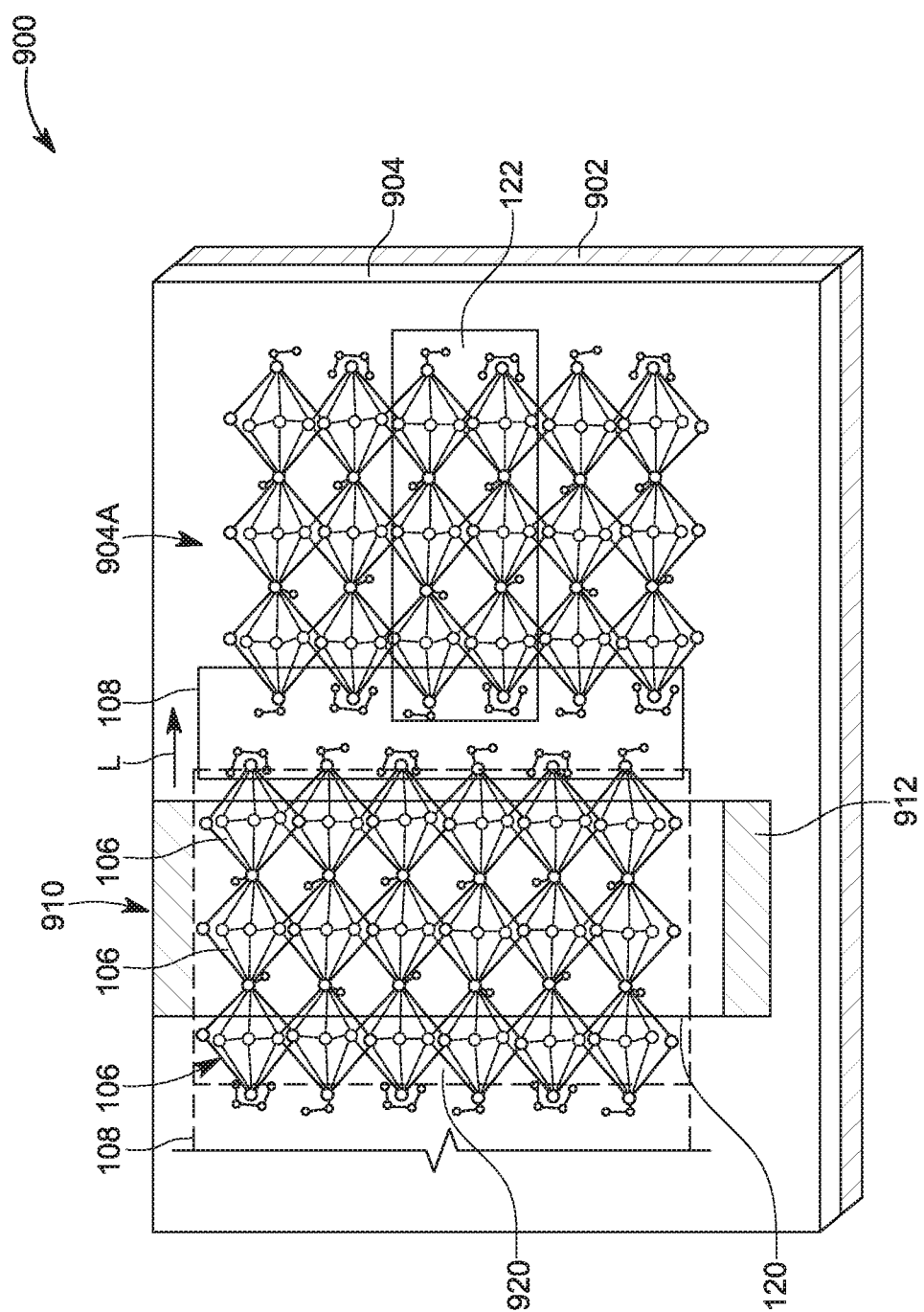
FIG. 9 illustrates a photovoltaic layer-edge device build to have plural inorganic layers sandwiched between two organic layers.

Note that a device 900 based on a single crystal EA-based 2D perovskite assembly 904 is shown in FIG. 9. The single crystal EA-based 2D perovskite assembly 904 is manufactured on a base 902, for example, silicon. A top surface 904A of the single crystal EA-based 2D perovskite assembly 904 is shown having three inorganic layers 106 sandwiched between two organic layers 108. Note that no organic layers are formed among the three inorganic layers. Two electrodes 910 and 912 are placed on the surface 904A to extend along a longitudinal axis L, which is perpendicular to a length of the three inorganic layers 106. Thus, a layer-edge 0° surface

120 is defined by these two electrodes. Note that the layer-edge 0° surface 120 does not have to coincide with the entire surface 920 spanned by the edges of the three inorganic layers 106. The size of the layer-edge 0° surface 120 is defined by the two electrodes and it needs to include at least one edge of an inorganic layer 106. However, the layer-edge 0° surface 120 may extend over more than one edge of the inorganic layers 106. For example, FIG. 9 shows that the layer-edge 0° surface 120 extends over the edges of two inorganic layers 106. The layer-edge 90° surface 122 is defined in similar to the layer-edge 0° surface 120, except that the layer-edge 90° surface 122 extends perpendicular to the inorganic layers 106, as also shown in FIG. 9. The electrodes corresponding to the layer-edge 90° surface 122 are omitted for simplicity. While FIGS. 1 and 9 show both layer-edge 0° surface 120 and layer-edge 90° surface 122 formed on the same surface of the corresponding device, one skilled in the art will understand that only one of these surfaces may be present, i.e., only the electrodes associated with one of these two surfaces may be formed on the top of the assembly for injecting or collecting the electrical current.

Figure 10A:
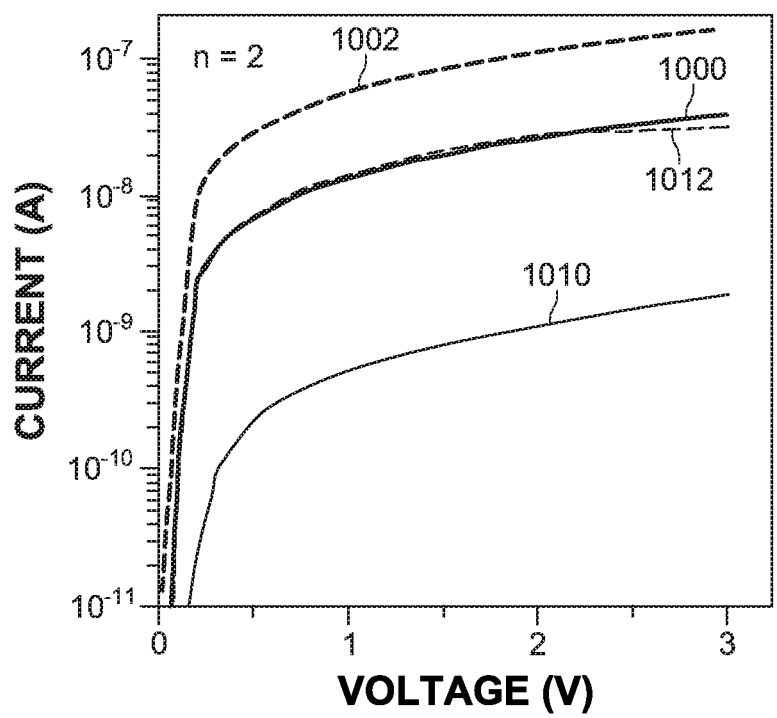
FIG. 10A illustrates dark and photo currents versus voltage for the photovoltaic layer-edge device having two inorganic layers sandwiched by two organic layers.
Figure 10B:
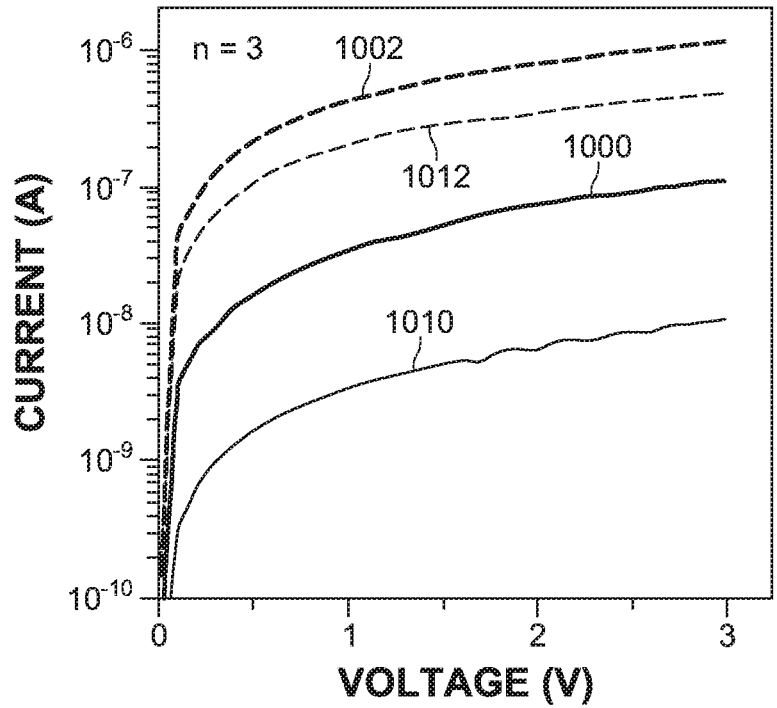
FIG. 10B illustrates dark and photo currents versus voltage for the photovoltaic layer-edge device having three inorganic layers sandwiched by two organic layers.
Figure 10C:
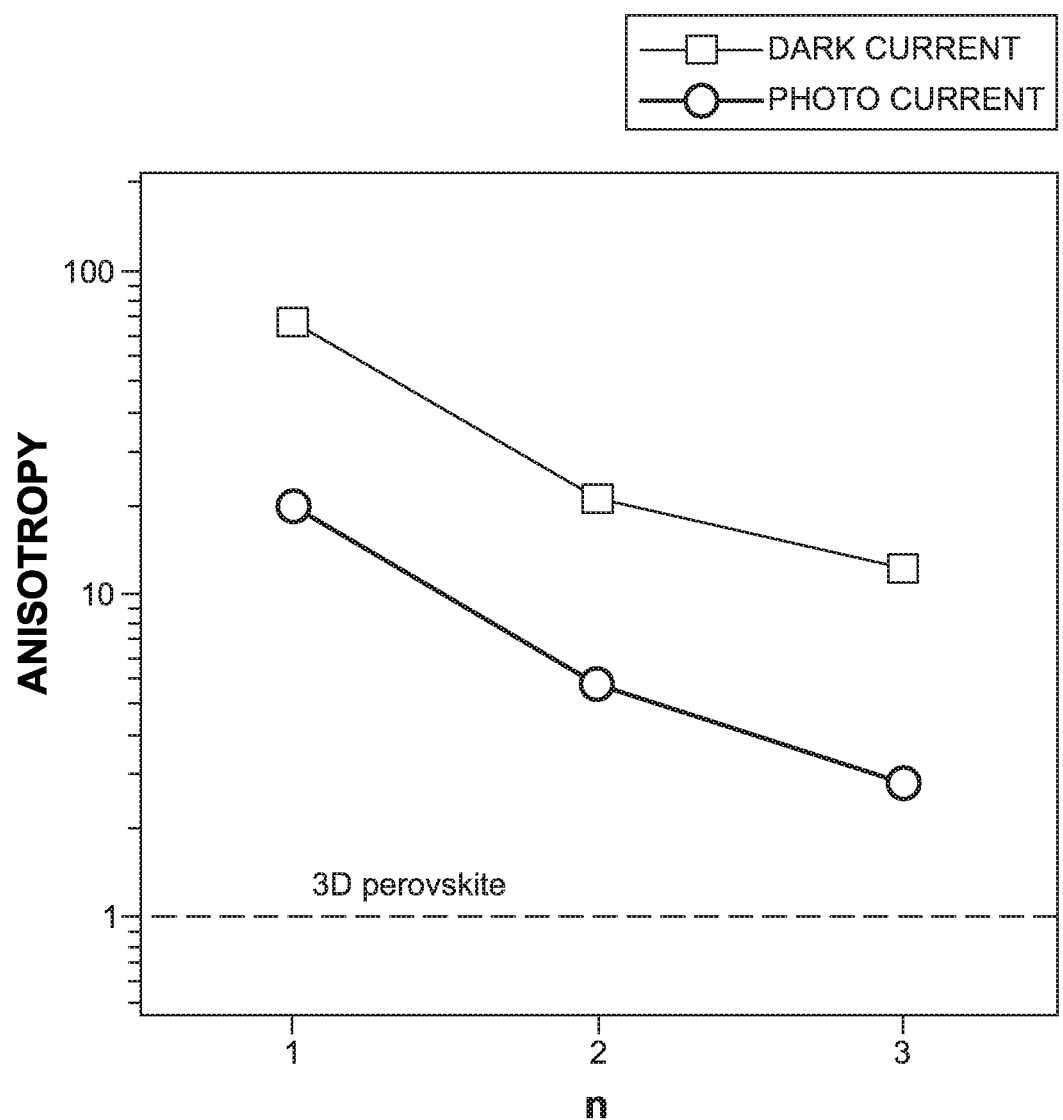
FIG. 10C illustrates the anisotropy of conductance and photoconductance as a function of the number of inorganic layers sandwiched between two organic layers.

To investigate the effect of the quantum confinement on the transport properties of the layer-edge surfaces, the I-V curve 1002 under dark conditions and the I-V curve 1000 in a light environment for the layer-edge 0° surface 120, and the corresponding curves 1012 and 1010 for the layer-edge 90° surface 122, for the EA-based 2D perovskites were measured, as shown in FIG. 10A for n=2 and in FIG. 10B for n=3. The anisotropy of the conductance and photo conductance is defined as the ratio of the current with bias equal to 3 volts in the layer-edge 0° surface 120 and the layer-edge 90° surface 122. As shown in FIG. 10C, the anisotropy is decreasing as the number n of inorganic layers is increasing. When n→∞, the case of the 3D perovskite is approached, and the electronic anisotropy is minimized and becomes equal to one.

The layer-edge 0° surface and the layer-edge 90° surface have different transport mechanisms. For the layer-edge 0° surface, the carrier transport mainly happens within the individual semiconductor layers 106. When an external electric field is applied parallel to the semiconductor layer 106, the carriers are drifted until scattered by charge impurities or phonons. Thus, the carrier transport in the layer-edge 0° surface can be described by the Drude model, in which the mobility is determined by the effective mass and the scattering relaxation time.

However, in the layer-edge 90° surface, the dominating transport process is the tunneling through the organic layers 108, and thus, the Drude model becomes invalid. When the effective mass was estimated from the discrete Fourier transform calculated band structures, the effective masses along the semiconductor plane (the layer-edge 0° surface) are similar for n=1, 2 and 3. However, the effective mass for the layer-edge 90° surface, which is perpendicular to the semiconductor plane, is smallest for n=1, and close to infinity for n=2 and 3. Those effective masses cannot explain the n dependent anisotropy of the conductivity in the sense of the Drude model, confirming that the Drude model cannot be used for the layer-edge 90° surface.

Figure 11A:
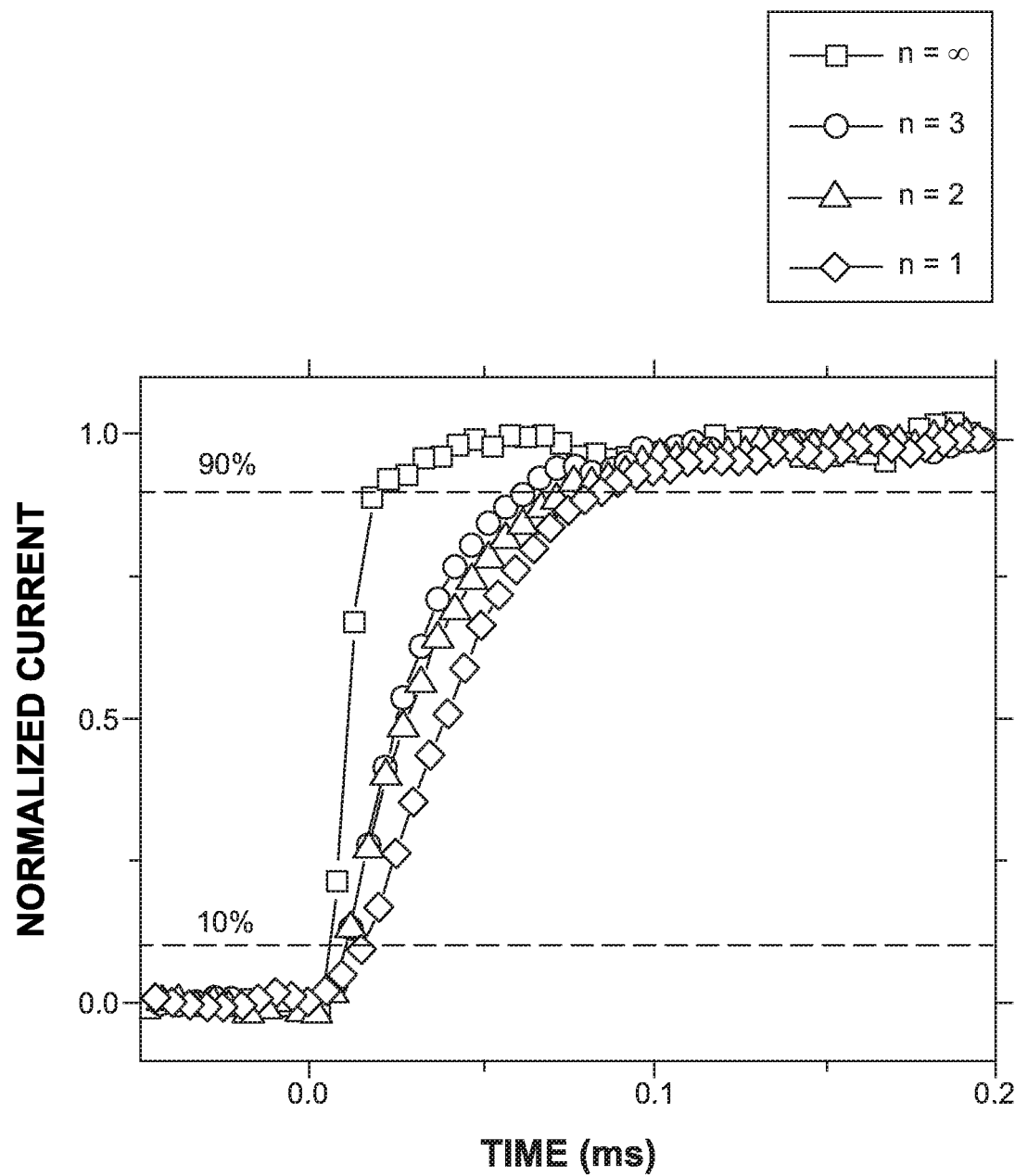
FIG. 11A illustrates the thickness dependent photo response of the photovoltaic layer-edge device and FIG. 11B illustrates the thickness dependent of the recovery current of the photovoltaic layer-edge device.
Figure 11B:
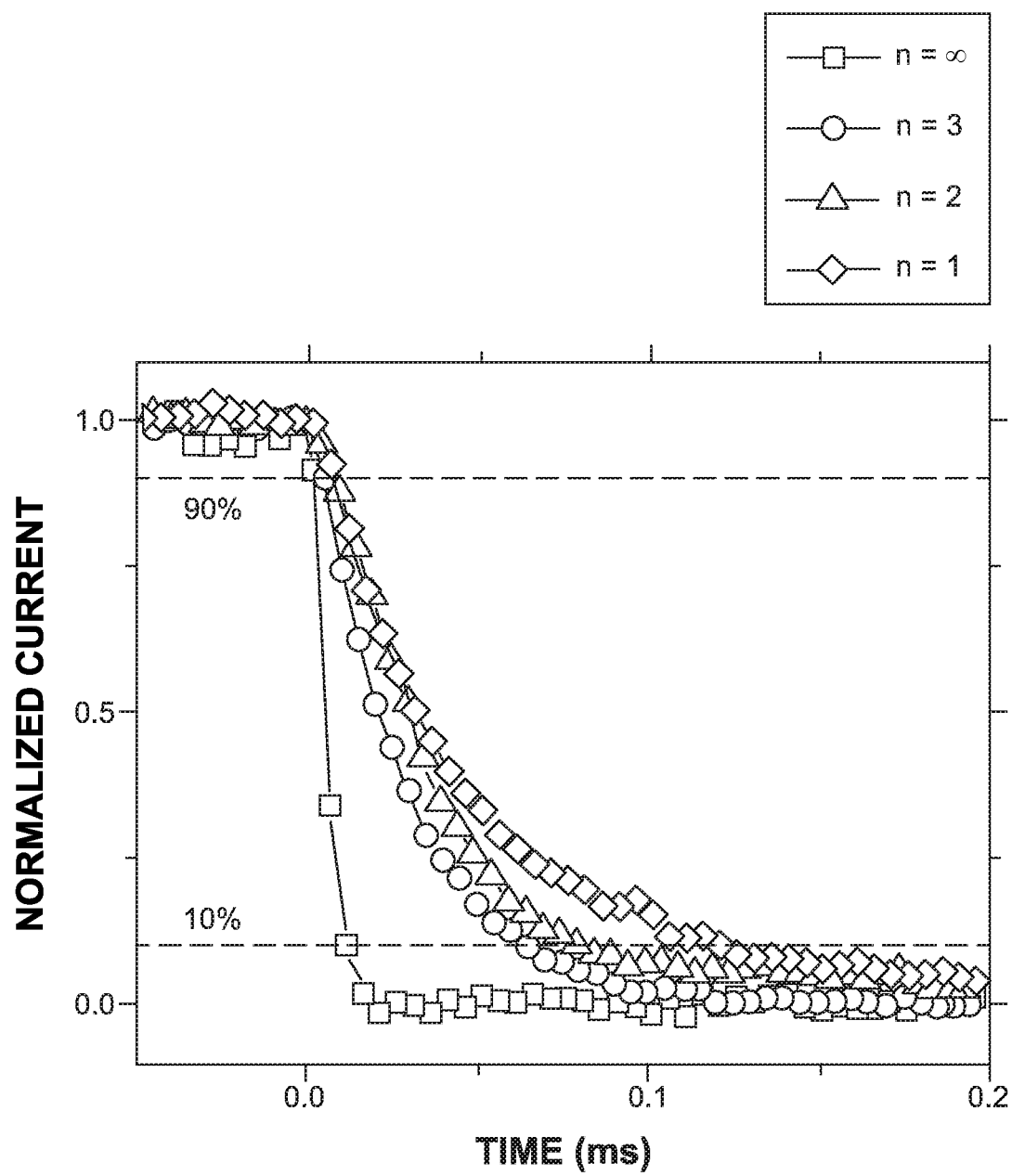

The photoresponse dynamics in the layer-edge surface devices was investigated by measuring the time-dependent photocurrent of 2D perovskites (n=1, 2, 3) and 3D perovskites. The time scale of the photoresponse dynamics measurement are quite larger than the lifetime of the carrier in regular time-resolved photoluminescence measurements, because the external electric field dissembles the electron-hole pairs in the excitons, and effectively extends the carrier lifetime. The response time r is defined as the time duration of the photocurrent changing from 10% to 90% of the maximum and vice versa. The rising and recovery current curves are shown in FIGS. 11A and 11B, respectively, and the response time r is decreasing with the increasing layer number n and reaches the minimum value when n=∞ (3D perovskites). The tendency of the response time r to decrease is highly associated with the quantum confinement effect, originated from the organic-inorganic-organic sandwich structures in 2D perovskite assembly 204 or 904. As n increases, the quantum confinement effect is weakened, resulting in the increase of carrier mobility, which shortens the drift time of the photo-generated carriers to the electrodes, and thus making the response time r to decrease.

The devices 200 and 900 discussed above not only exhibit good carrier transport along layer-edge surfaces (which are perpendicular to the inorganic layers), but they also show good humidity sensitivity. Because the surface of a perovskite-based device is significantly influenced by environment gases and humidity, the transport behavior, which mainly occurs near the surface of the single crystal device 200 or 900, is quite sensitive to the humidity when the device is operated in open air. In 3D perovskites, the sensitivity to humidity has been studied in the single crystal and thin film. However, the sensitivity of 2D perovskites to humidity is expected to be quite different because of its layered structure and because of the adopted various organic groups, especially in the layer-edge surfaces.

Figure 12A:
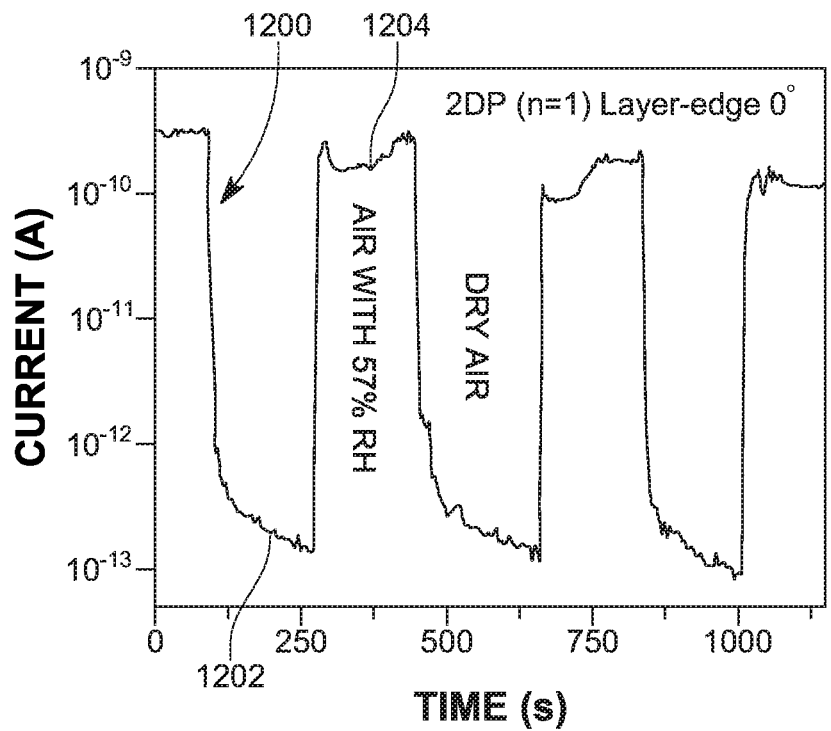
FIG. 12A illustrates the dark current in dry air and in humid air for the photovoltaic layer-edge device.
Figure 12B:
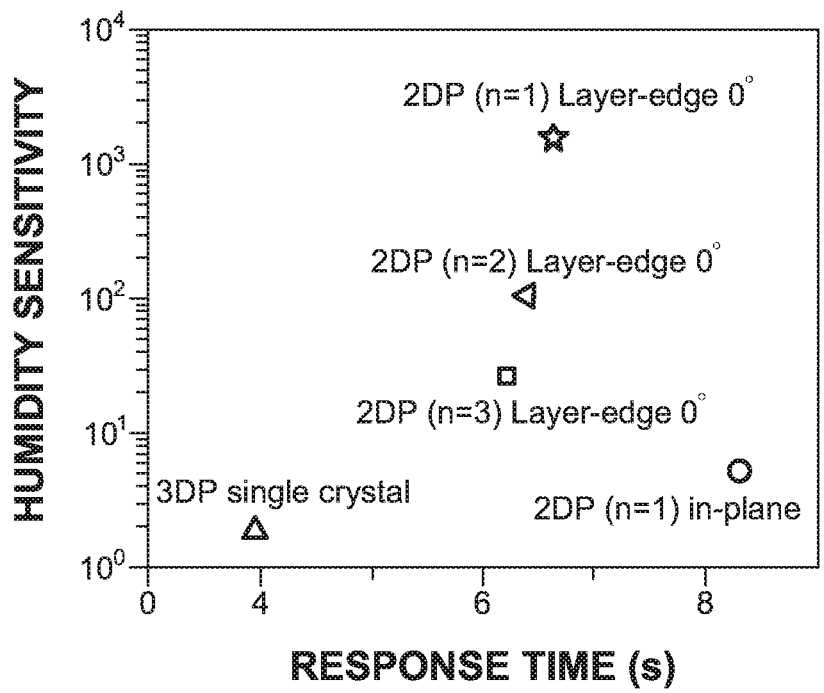
FIG. 12B illustrates the humidity sensitivity and response time for various perovskite-based materials.

As shown in FIG. 12A, the measured electrical current 1200 of the layer-edge 0° surface (with n=1) in dry air and 57% relative humidity (RH) show reversible three-order-magnitude changes, and the response time to the water absorption is approximately 6.6 s, as illustrated in FIG. 12B. In this embodiment, the response time is defined as the time required to change the current amplitude 1202 measured in dry air to 90% of the maximum current amplitude 1204 at 57% RH.

The humidity response for the layer-edge surface based devices with n=2 and 3, layer-edge device 90°, the in-plane 2D perovskite device with n=1, and the (110) surface 3D perovskite device were tested as shown in FIG. 12B. The performance of the humidity sensing for each perovskite-based device is estimated based on a graph that plots (1) the humidity sensitivity, which is defined as the ratio of (i) the current for the 57% RH conditions and (ii) the current for the dry air, versus (2) the response time (see FIG. 12B). The 2D perovskite layer-edge 0° surface device with n=1 presents the best humidity sensitivity, and a relatively outstanding response time. When compared to the best humidity sensor based on hybrid perovskite so far [5], the performance of the humidity sensitivity and the response time in 2D perovskite layer-edge device with n=1 are better than the others. As the number n of inorganic layers increases, the humidity sensitivity of layer-edge device decreases. The reason for this is that the ratio of the organic layers to the inorganic layers will decrease as the number n increases, which means that the density of the hydroxyl groups on the layer-edge surface decreases, and the ability to absorb water decreases as well.

The increased humidity sensitivity of the layer-edge surface device noted in FIG. 12B is explained as follows. The layer-edge surface of the 2D perovskite is very rough, especially when compared to the in-plane surface (after mechanical exfoliation) in which the AFM images show an atomic flat surface with much less defects. Such structural defects in the layer-edge surface can trap a large amount of water molecules, which is proved by the large difference between the humidity sensitivity of the layer-edge surface device and the in-plane surface device. On the other hand, the layer-edge surface has abundant hydroxyl groups, which makes it easy to absorb the water in the air. This water absorption mechanism can be verified by observing the speed of the current recovery when the device is moved between the dry air and the RH 57% humid air. The current recovery speed in 2D perovskite with the hydroxyl groups, as shown in FIG. 12A, is much slower than that in 2D PEA perovskites, in which the hydroxyl groups are absent, indicating a process of desorbing water from the hydroxyl groups.

Figure 13:
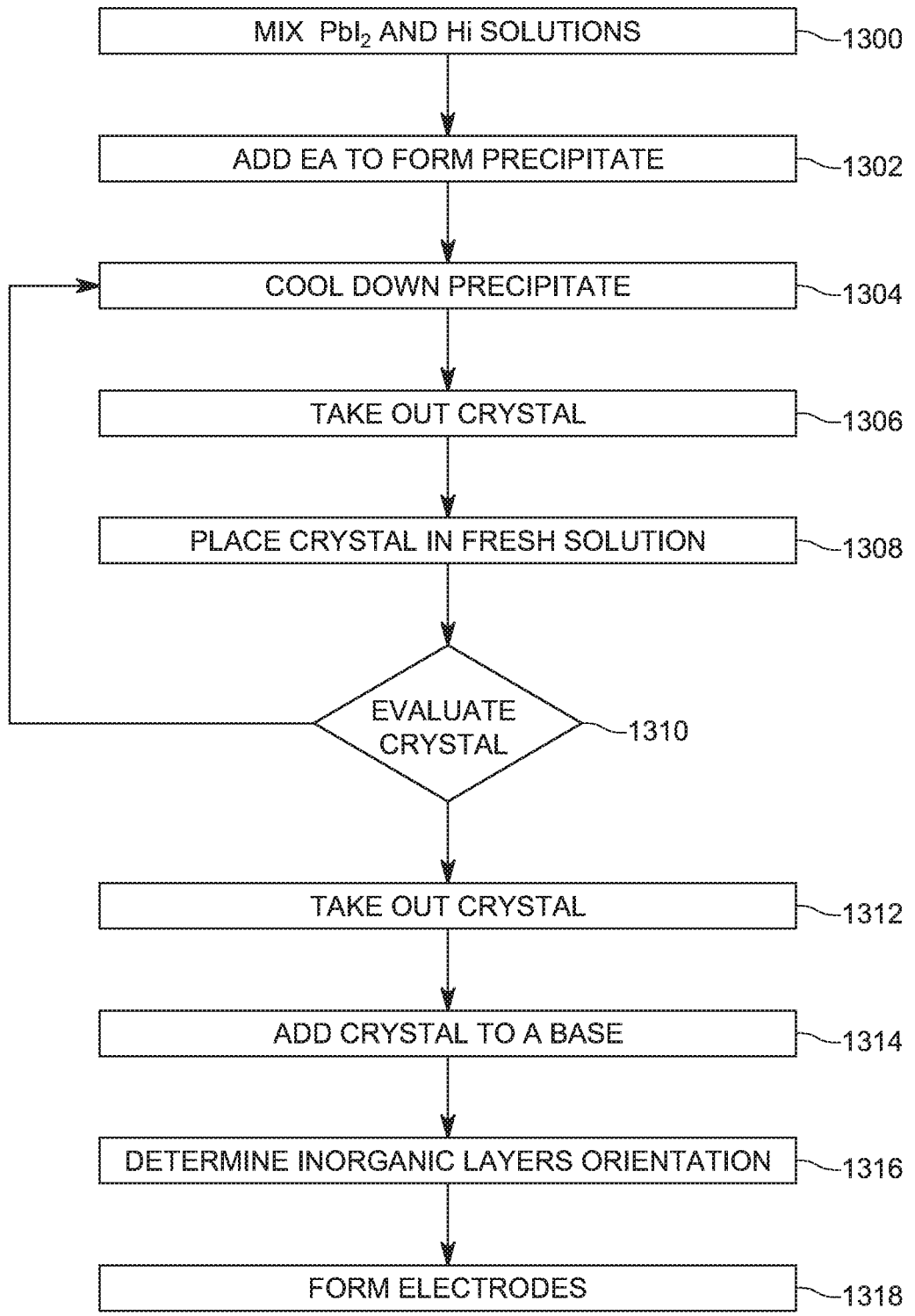
FIG. 13 is a flowchart of a method for forming the photovoltaic layer-edge device with a single inorganic layer sandwiched between organic layers.

A method for forming the 2D perovskite layer assembly 104 is now discussed with regard to FIG. 13. 2D perovskites $(HOC_2H_4NH_3)$ single crystals are grown using a cooling method. In step 1300, 1.6 g $PbI_2$ is mixed with 16 ml of 57% HI solution in a vial, and dissolved by sonication at room temperature. In step 1302, 0.8 ml $HOC_2H_4NH_2$ is added to form a precipitate. The solution is then cooled down in step 1304 to 4° C. After one week, the formed crystal was taken out of the vial in step 1306, and then placed in step 1308 in a freshly prepared solution as in step 1302. Steps 1304 to 1308 are repeated for a given time, for example, for 5 weeks, which is evaluated in step 1310. When the single crystal 2D perovskite layer assembly 104 is deemed to be formed with the desired sizes, it is taken out in step 1312. Optionally, in step 1314, the single crystal 2D perovskite layer assembly 104 is placed on a base 102, for example, silicon, to form the device 100. In step 1316, the orientation of the inorganic layers is determined, for example, using an imaging tool, and in step 1318 two or more electrodes are formed perpendicular to an in-plane surface of the assembly 104, to define either the layer-edge 0° surface 120 or the layer-edge 90° surface 122. Optionally, the obtained device 100 may be encapsulated with a protective layer, e.g., polymide.

Figure 14:
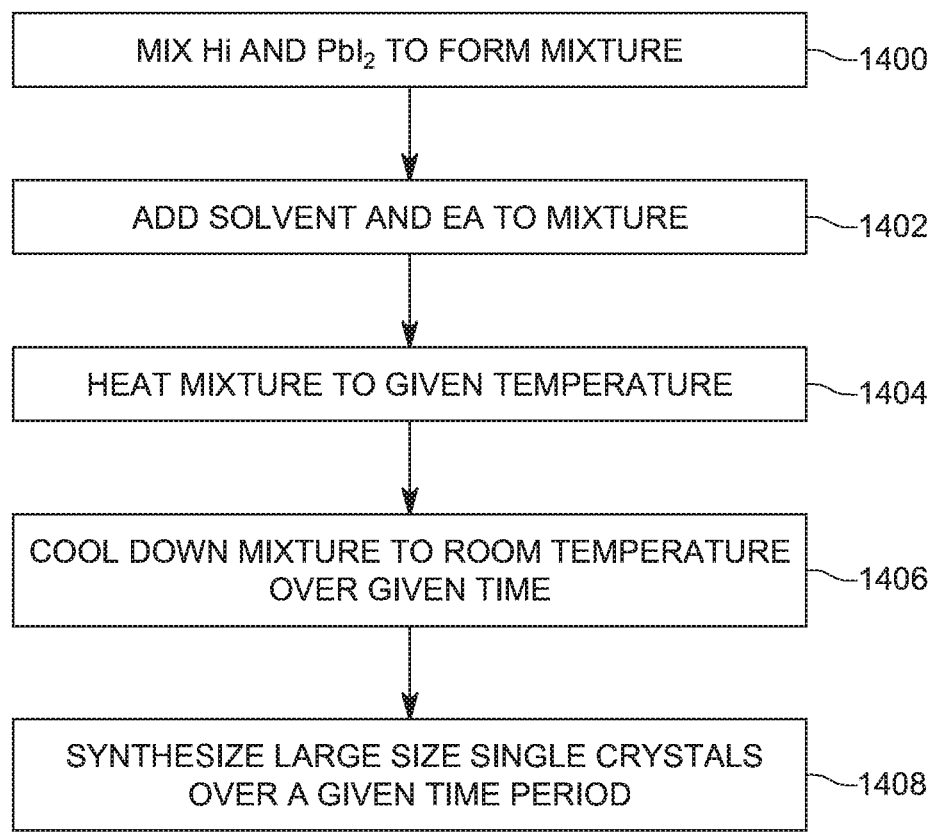
FIG. 14 is a flowchart of a method for forming the photovoltaic layer-edge device with plural inorganic layers sandwiched between organic layers.

The device 900 previously discussed may be manufactured as illustrated in the flowchart of FIG. 14. For growing a device 900 having n=2 layers of perovskites, in step 1400, 16 ml HI (57 wt. %) are mixed with 5.5 gram of $PbI_2$ powder to form a solution. After the powder dissolved, 0.4 ml MA solvent and 0.8 ml EA solvent are added in step 1402 and then the mixture is heated in step 1404 to 90° C. After one hour, the mixture is cooled in step 1406 to 60° C. and it is kept for two days at this temperature. Then, the mixture is cooled down to room temperature. Large size single crystal structures are then synthesized in a few days in step 1408. If the number of inorganic layers is increased to n=3 for the perovskite single crystal, the method may be altered to use 12 ml HI solution, 5 gram $PbI_2$ powder, 0.4 ml MA and 0.8 ml EA. Then the heating and cooling process is the same as for the n=2 perovskites. The obtained 2D perovskite layer assembly is then fixed to a base and two or more electrodes are added to obtain the device 900, similar to the method for forming the device 100. Optionally, the 2D perovskite layer assembly is encapsulated with a protective layer. If the device 100 or 900 is used as a humidity sensor, then the edge-layer surface between the electrodes is not covered so that it can directly interact with the ambient humidity.

Figure 15:
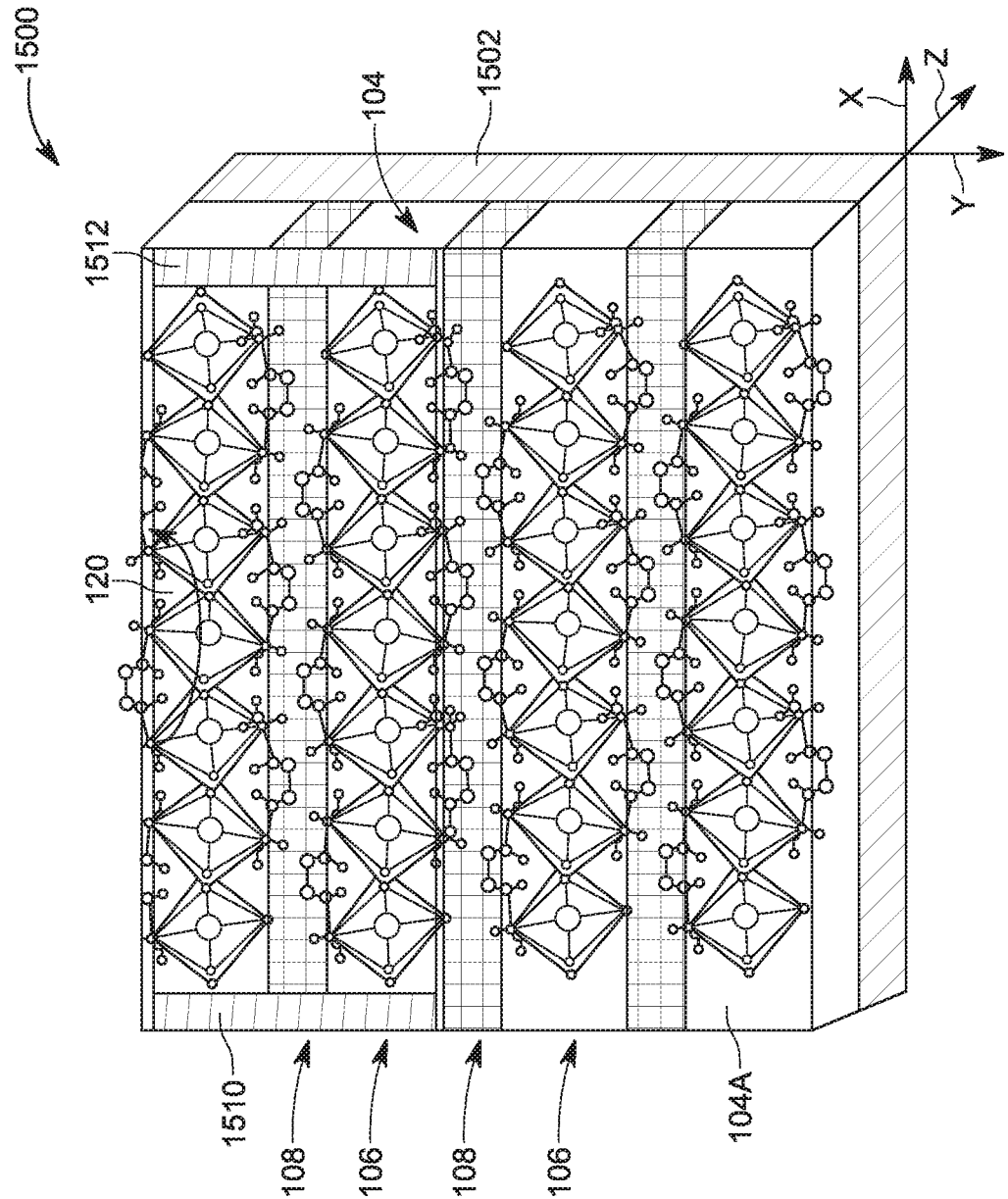
FIG. 15 illustrates a photovoltaic layer-edge device that uses a layer-edge 0° surface for carrier transport.
Figure 16:
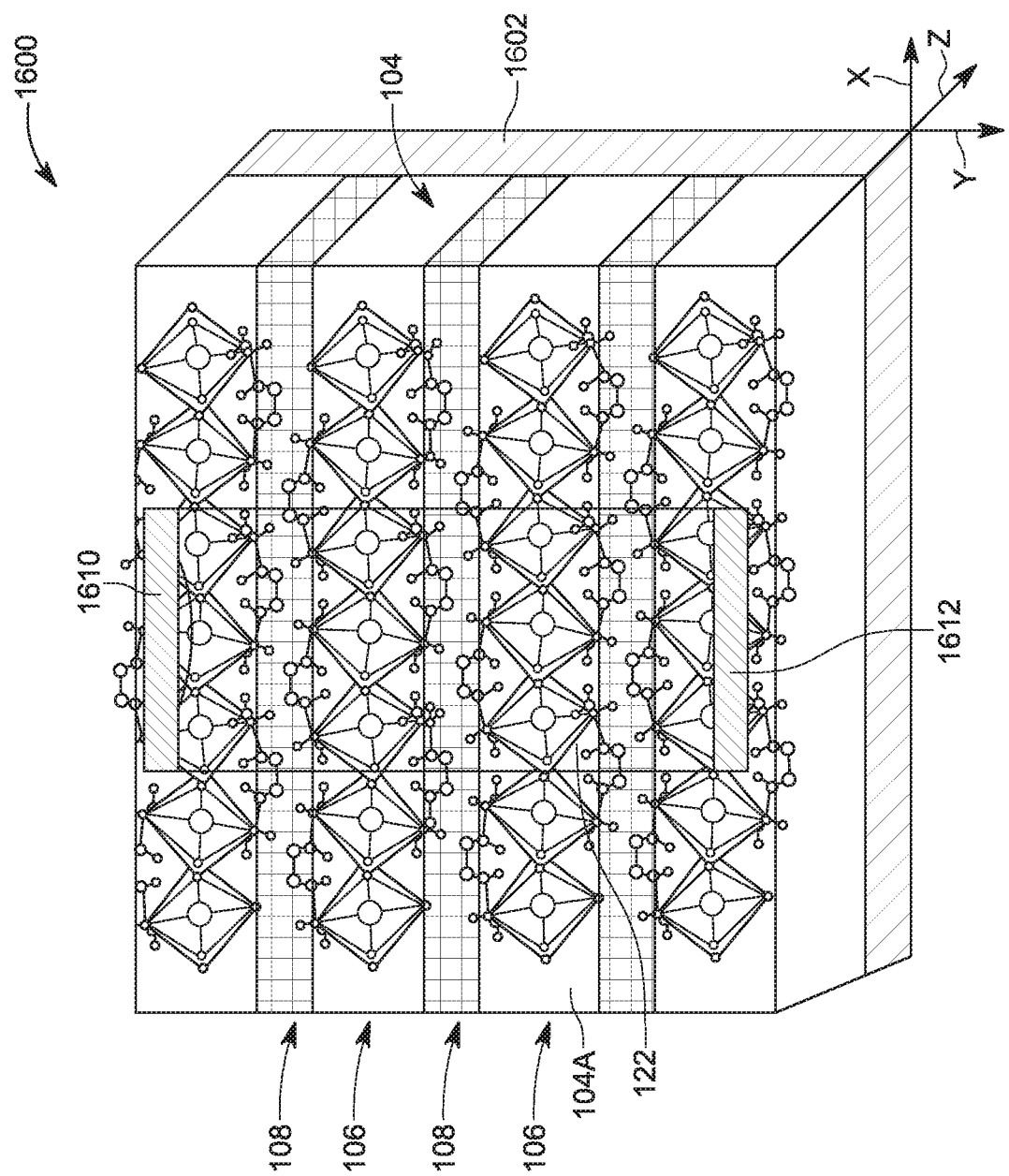
FIG. 16 illustrates a photovoltaic layer-edge device that uses a layer-edge 90° surface for carrier transport.

The inventors have observed that a layer-edge 0° surface device 1500, as illustrated in FIG. 15, is more suited to work as a light harvesting device, e.g., solar panel that transforms optical energy into electrical energy, while a layer-edge 90° surface device 1600, as illustrated in FIG. 16, is more suited to work as a light emitting device, e.g., an LED diode, which transforms electrical energy into optical energy. While each of the devices 1500 and 1600 may include the 2D perovskite layer assembly 104 or the 2D perovskite layer assembly 904, it is noted that these devices are similar except for the positioning of the electrodes 1510 and 1512 on a surface 104A of the 2D perovskite layer assembly 104 along a direction X, which is parallel to the inorganic layer 106 for the device 1500, while the electrodes 1610 and 1612 are formed on the surface 104A, along a direction Y, which is perpendicular to the inorganic layer 106. FIG. 15 further shows the layer-edge 0° surface 120 and a base 1502 and FIG. 16 shows the layer-edge 90° surface 122 and a base 1602 for the device 1602. Note that the layer-edge 0° surface 120 and the layer-edge 90° surface 122 include the edges of the inorganic layers 106 and/or edges of the organic layers 108. Any of the devices discussed herein may also be used as a humidity sensor as the conductance of the layer-edge surfaces are very sensitive to the ambient humidity. Thus, by measuring the conductance of the layer-edge surfaces, calibration curves may be generated that are then used to determine the humidity in the air. If the devices 1500 or 1600 are to be used for determining the humidity in the air, no protective film is formed above the surfaces 120 or 122 to allow the water vapors to directly interact with the layer-edge surfaces.

The inorganic layer of the device 1500 or 1600 extends in a plane defined by two orthogonal axes X and Z, and the layer-edge 0° surface and the layer-edge 90° surface extend in a plane defined by two orthogonal axes X and Y. In one application, the layer-edge 0° surface includes an edge of the inorganic layer. In another application, the layer-edge 0° surface includes first and second edges of the first and second organic layers. In still another application, the layer-edge 90° surface includes plural edges of inorganic layers. In one embodiment, the layer-edge 90° surface includes first and second edges of the first and second organic layers.

The organic layer may include an organic material having a dielectric constant larger than 20. In one application, the inorganic layer includes Pb and I elements and the first and second organic layers include $HOC_2H_4NH_3^+$. In one embodiment, the 2D organic-inorganic perovskite layer assembly includes $(HOC_2H_4NH_3^+)_2PbI_4$. The 2D organic-inorganic perovskite layer assembly is a single crystal. In one application, the 2D organic-inorganic perovskite layer assembly includes plural inorganic layers sandwiched between the first and second organic layers.

Figure 17:
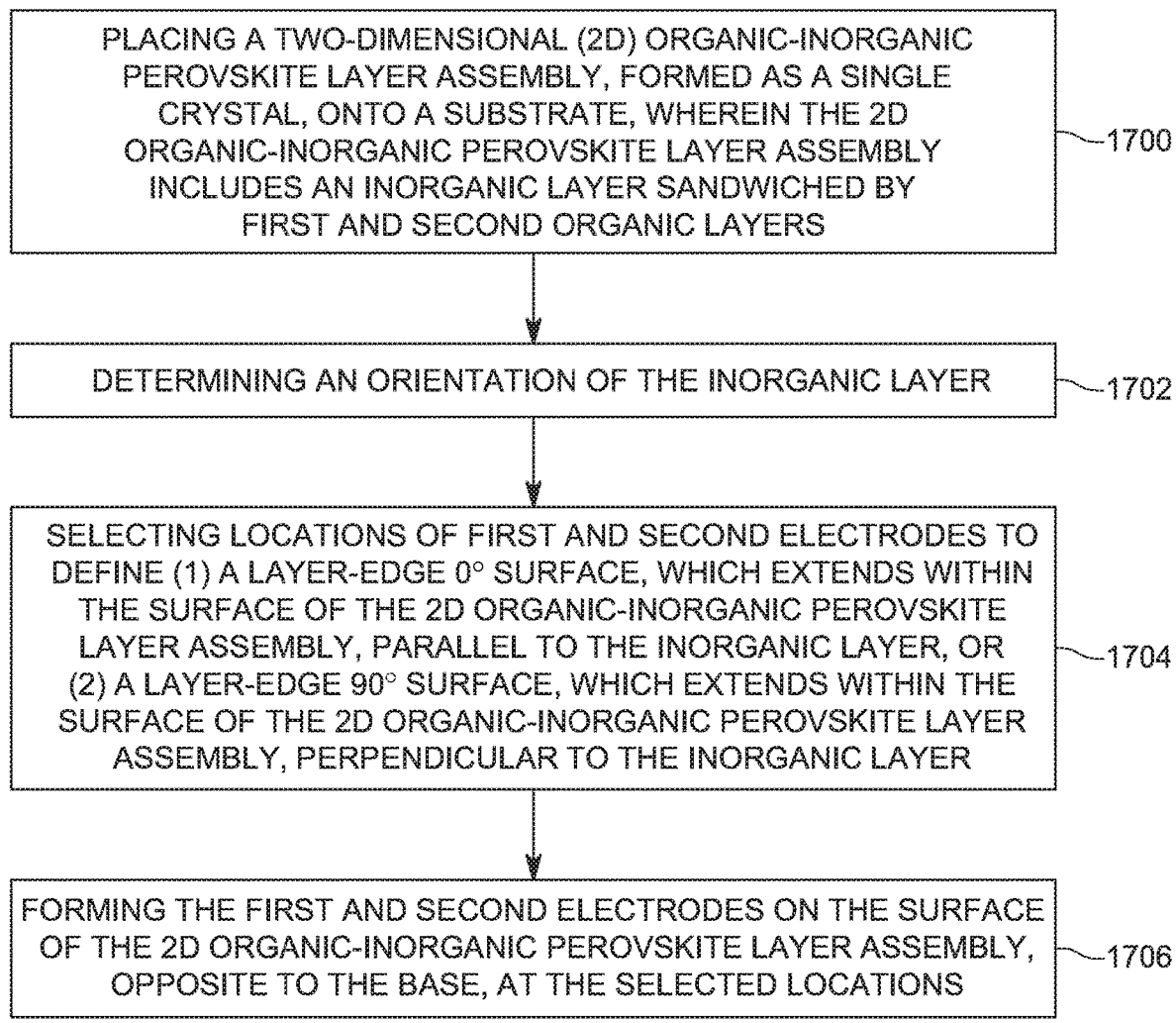
FIG. 17 is a flowchart of a method for making a photovoltaic layer-edge device that uses a layer-edge surface for carrier transport.

A method for making a photovoltaic device 1500 or 1600 that transforms electrical energy into optical energy or vice versa, is illustrated in FIG. 17 and includes a step 1700 of placing a two-dimensional (2D) organic-inorganic perovskite layer assembly, formed as a single crystal, onto a substrate, where the 2D organic-inorganic perovskite layer assembly includes an inorganic layer sandwiched by first and second organic layers, a step 1702 of determining an orientation of the inorganic layer, a step 1704 of selecting locations of first and second electrodes to define (1) a layer-edge 0° surface, which extends within the surface of the 2D organic-inorganic perovskite layer assembly, parallel to an edge of the inorganic layer, or (2) a layer-edge 90° surface, which extends within the surface of the 2D organic-inorganic perovskite layer assembly, perpendicular to the inorganic layer, and a step 1706 of forming the first and second electrodes on the surface of the 2D organic-inorganic perovskite layer assembly, opposite to the base, at the selected locations. In one application, the inorganic layer extends in a plane defined by two orthogonal axes X and Z, and the layer-edge 0° surface or the layer-edge 90° surface extends in a plane defined by two orthogonal axes X and Y.

The disclosed embodiments provide organic-inorganic, 2D perovskite, single crystal, layer-edge devices that show very good photonic properties, which are suitable as light generation devices and/or light emission devices. The layer-edge devices are also sensitive to humidity and can be used to measure the humidity in air. It should be understood that this description is not intended to limit the invention. On the contrary, the embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Blancon, J.-C., et al. Extremely efficient internal exciton dissociation through edge states in layered 2D perovskites. Science 355, 1288-1292 (2017).
[2] Tsai, M. L., et al. Single Atomically Sharp Lateral Monolayer p-n Heterojunction Solar Cells with Extraordinarily High Power Conversion Efficiency. Adv. Mater. 29, 1701168 (2017).
[3] Mercier, N., et al. Unique hydrogen bonding correlating with a reduced band gap and phase transition in the hybrid perovskites (HO(CH2)2NH3)2PbX4(X=I, Br). Inorg. Chem. 43, 8361-8366 (2004).
[4] Cheng, B., et al. Extremely reduced dielectric confinement in two-dimensional hybrid perovskites with large polar organics. Commun. Phys. 1, 80 (2018).
[5] Ren, K., et al. Turning a disadvantage into an advantage: synthesizing high-quality organometallic halide perovskite nanosheet arrays for humidity sensors. J. Mater. Chem. C 5, 2504-2508 (2017).

What is claimed is:

1. A photovoltaic device that absorbs optical energy and generates electrical energy, the photovoltaic device comprising:
a base;
a two-dimensional (2D) organic-inorganic perovskite layer assembly located on the base, wherein the 2D organic-inorganic perovskite layer assembly includes an inorganic layer sandwiched by first and second organic layers; and
first and second electrodes formed on a surface of the 2D organic-inorganic perovskite layer assembly, opposite to the base,
wherein a location of the first and second electrodes is selected to define a layer-edge 0° surface, which extends within the surface of the 2D organic-inorganic perovskite layer assembly, parallel to an edge of the inorganic layer, and
wherein the layer-edge 0° surface is in direct contact with each of the inorganic layer and the first and second organic layers.

2. The photovoltaic device of claim 1, wherein the inorganic layer extends in a plane defined by two orthogonal axes X and Z, and the layer-edge 0° surface extends in a plane defined by two orthogonal axes X and Y.

3. The photovoltaic device of claim 1, wherein the layer-edge 0° surface includes the edge of the inorganic layer.

4. The photovoltaic device of claim 3, wherein the layer-edge 0° surface includes first and second edges of the first and second organic layers.

5. The photovoltaic device of claim 1, wherein the first and second organic layers include an organic material having a dielectric constant larger than 20.

6. The photovoltaic device of claim 1, wherein the inorganic layer includes Pb and I elements and the first and second organic layers include $HOC_2H_4NH_3^+$.

7. The photovoltaic device of claim 1, wherein the 2D organic-inorganic perovskite layer assembly includes $(HOC_2H_4NH_3^+)_2PbI_4$.

8. The photovoltaic device of claim 1, wherein the 2D organic-inorganic perovskite layer assembly is a single crystal.

9. The photovoltaic device of claim 1, wherein the 2D organic-inorganic perovskite layer assembly includes plural inorganic layers sandwiched between the first and second organic layers.

10. A photovoltaic device that absorbs electrical energy and generates optical energy, the photovoltaic device comprising:
a base;
a two-dimensional (2D) organic-inorganic perovskite layer assembly located on the base, wherein the 2D organic-inorganic perovskite layer assembly includes an inorganic layer sandwiched by first and second organic layers; and
first and second electrodes formed on a surface of the 2D organic-inorganic perovskite layer assembly, opposite to the base,
wherein a location of the first and second electrodes is selected to define a layer-edge 90° surface, which extends within the surface of the 2D organic-inorganic perovskite layer assembly, perpendicular to the inorganic layer, and
wherein the layer-edge 90° surface is in direct contact with each of the inorganic layer and the first and second organic layers.

11. The photovoltaic device of claim 10, wherein the inorganic layer extends in a plane defined by two orthogonal axes X and Z, and the layer-edge 90° surface extends in a plane defined by two orthogonal axes X and Y.

12. The photovoltaic device of claim 10, wherein the layer-edge 90° surface includes plural edges of plural inorganic layers.

13. The photovoltaic device of claim 12, wherein the layer-edge 90° surface includes first and second edges of the first and second organic layers.

14. The photovoltaic device of claim 10, wherein the first and second organic layers include an organic material having a dielectric constant larger than 20.

15. The photovoltaic device of claim 10, wherein the inorganic layer includes Pb and I elements and the first and second organic layers include $HOC_2H_4NH_3^+$.

16. The photovoltaic device of claim 10, wherein the 2D organic-inorganic perovskite layer assembly includes $(HOC_2H_4NH_3^+)_2PbI_4$.

17. The photovoltaic device of claim 10, wherein the 2D organic-inorganic perovskite layer assembly is a single crystal.

18. The photovoltaic device of claim 10, wherein the 2D organic-inorganic perovskite layer assembly includes plural inorganic layers sandwiched between the first and second organic layers.

19. A method for making a photovoltaic device that transforms electrical energy into optical energy or vice versa, the method comprising:
- placing a two-dimensional (2D) organic-inorganic perovskite layer assembly, formed as a single crystal, onto a substrate, wherein the 2D organic-inorganic perovskite layer assembly includes an inorganic layer sandwiched by first and second organic layers;
- determining an orientation of the inorganic layer;
- selecting locations of first and second electrodes to define
  (1) a layer-edge 0° surface, which extends within the surface of the 2D organic-inorganic perovskite layer assembly, parallel to an edge of the inorganic layer, or
  (2) a layer-edge 90° surface, which extends within the surface of the 2D organic-inorganic perovskite layer assembly, perpendicular to the inorganic layer; and
- forming the first and second electrodes on the surface of the 2D organic-inorganic perovskite layer assembly, opposite to the base, at the selected locations,
- wherein the layer-edge 0° surface is in direct contact with each of the inorganic layer and the first and second organic layers when the first and second electrodes were selected to form the layer-edge 0° surface, or
- wherein the layer-edge 90° surface is in direct contact with each of the inorganic layer and the first and second organic layers when the first and second electrodes were selected to form the layer-edge 90° surface.

20. The method of claim 19, wherein the inorganic layer extends in a plane defined by two orthogonal axes X and Z, and the layer-edge 0° surface or the layer-edge 90° surface extends in a plane defined by two orthogonal axes X and Y.

\* \* \* \* \*